United States Patent
Yoshida et al.

[11] Patent Number: 6,112,525
[45] Date of Patent: Sep. 5, 2000

[54] COOLING UNIT

[75] Inventors: Yoshifumi Yoshida; Matsuo Kishi; Minao Yamamoto, all of Chiba, Japan

[73] Assignee: Seiko Instruments R&D Center Inc., Japan

[21] Appl. No.: 09/107,588

[22] Filed: Jun. 16, 1998

[30] Foreign Application Priority Data

Aug. 4, 1997 [JP] Japan .................................. 9-209518

[51] Int. Cl.$^7$ .................................................. F25B 21/00
[52] U.S. Cl. ...................... 62/3.7; 62/3.3; 62/3.2
[58] Field of Search ................. 62/3.3, 3.7, 3.2

[56] References Cited

U.S. PATENT DOCUMENTS

| | | | |
|---|---|---|---|
| 5,097,829 | 3/1992 | Quisenberry | 128/400 |
| 5,367,890 | 11/1994 | Doke | 62/3.7 |
| 5,431,021 | 7/1995 | Gwilliam et al. | 62/3.7 |
| 5,522,215 | 6/1996 | Matsunaga et al. | 62/32 |
| 5,576,512 | 11/1996 | Doke | 136/203 |
| 5,655,375 | 8/1997 | Ju | 62/3.6 |
| 5,704,213 | 1/1998 | Smith et al. | 62/3.7 |
| 5,712,448 | 1/1998 | Vadersande et al. | 136/203 |
| 5,802,855 | 9/1998 | Yamaguchi et al. | 62/3.2 |

*Primary Examiner*—Henry Bennett
*Assistant Examiner*—Mark Shulman
*Attorney, Agent, or Firm*—Adams & Wilks

[57] ABSTRACT

A cooling unit is structured such that a temperature sensor is formed on at least one of the substrates that form a thermoelectric conversion device to which thermoelectric elements are connected, an input/output electrode extending from the temperature sensor and an electrode formed on the other surface opposed to the substrate on which the temperature sensor is formed are connected to each other by electrically conductive material, and a control circuit for controlling a current supplied to the thermoelectric conversion device according to an output of the temperature sensor is connected thereto. By this structure, only one surface of the substrate is subjected to a manufacturing process, and there is no need for a temperature sensor such as a thermistor to be supplied as a discrete component for mounting on a substrate of the thermoelectric conversion device. There is also no need for a temperature sensor to be connected directly on a surface of the thermoelectric conversion device which is to be adjusted in temperature, thereby being capable of easily and accurately adjusting the temperature at the thermoelectric conversion device.

33 Claims, 15 Drawing Sheets

COOLING UNIT

BACKGROUND OF THE INVENTION

1. Field of the Invention

The present invention relates to a cooling unit using a thermoelectric conversion device that conducts cooling and heating based on Peltier effect and heat power generation based on Seebeck effect.

2. Description of the Related Art

In general, the thermoelectric conversion device is structured in such a manner that a p-type thermoelectric material chip and an n-type thermoelectric material chip are interposed between two substrates, and the p-type thermoelectric material chip and the n-type thermoelectric material chip which are formed on the substrates are joined to each other through a conductive material such as metal in the form of a p-n junction.

Up to now, the thermoelectric conversion device thus structured has, through the application of electricity, a function of adjusting a temperature by cooling or heating one of those substrates and a function of generating a power by differentiating the temperatures of those two substrates. To achieve those functions, it is necessary to detect and control the temperatures of those two substrates. However, a temperature sensor such as a thermistor is mounted on the substrates by adhesion or the like, and input/output electrodes of a temperature sensor and a drive terminal of the thermoelectric conversion device are connected to an external control unit and the like through a lead wire, etc.

Also, in the case where the thermoelectric conversion device is equipped with a control circuit, the thermoelectric conversion device is connected to an external control circuit through a lead wire or the like. Accordingly, the output of the temperature sensor and the drive current of the thermoelectric conversion device are matched with the control circuit after all of the temperature sensor, the control circuit and so on are mounted on and connected to the thermoelectric conversion device.

As described above, the conventional thermoelectric conversion device is required to mount the temperature sensor such as the thermistor on the substrate in order to achieve precise temperature detection or temperature control. For that reason, it is necessary to provide a region on which the temperature sensor is mounted on the substrate of the thermoelectric conversion device, and also to take account of the influence of a heat capacity of the temperature sensor. Thus, there arises such a problem that the capability beyond the performance as originally required is necessary for the thermoelectric conversion device.

Furthermore, in case of employing the thermoelectric conversion device as a cooling unit, it is general that the input/output electrodes of the thermoelectric conversion device is attached to a heat radiation sided substrate so as to prevent the load of cooling. On the other hand, it is general that the temperature sensor such as the thermistor is mounted on the cooling sided substrate. This case leads to such a problem that a heat flows into the cooling unit from the external through a lead wire connecting the temperature sensor and the external control unit, to thereby increase the load on cooling.

Also, because a three-dimensional structure is applied to the cooling unit, there arises such a problem that an increase in the costs and a deterioration of the yield are induced by the complicated structure even in a so-called packaging process in which the temperature sensor and the external control unit are connected.

Further, in order to connect the control circuit to the cooling unit for adjusting the temperature, the thermoelectric conversion device, the temperature sensor and the control circuit are required to be matched with each other. This leads to such a problem that it takes time to conduct trimming because they are different devices.

Still further, in order to provide a target temperature in the control circuit, the supply of electricity to the thermoelectric conversion device is switchingly controlled. However, the semiconductor laser used for communication suffers from such a problem that switching noises in control of the thermoelectric conversion device adversely affect the communication.

The above-mentioned problems are remarkable particularly in the small-sized thermoelectric conversion device. For example, the semiconductor laser to be used for optical communications must be cooled by the thermoelectric conversion device because the of its heating. However, since the thermoelectric conversion device to be used is so small in size such as several mm in square. Therefore, if a temperature sensor, etc. are mounted on the semiconductor laser, the cooling performance is largely adversely affected by the temperature sensor, etc., thereby resulting in problems relating to the downsizing and power consumption as the while. Further, although the thermoelectric conversion device is small in size, that is, several mm square, a large space is required for connecting the control circuit, etc., resulting in a problem that there is no scale merit.

SUMMARY OF THE INVENTION

In view of the above, an object of the present invention is to solve the above problems inherent to the prior art.

In order to achieve the above object, a cooling unit of the present invention is structured such that: a temperature sensor is formed on at least one of substrates that form a thermoelectric conversion device to which thermoelectric elements are connected; an input/output electrode extending from the temperature sensor and an electrode formed on the other surface opposed to the substrate on which the temperature sensor is formed are connected to each other by electrically conductive material; and a control circuit for controlling a current to be supplied to the thermoelectric conversion device in accordance with an output of the temperature sensor is connected thereto. With this structure, since only one surface of the substrate is subjected to a manufacturing process, there is no necessity that a temperature sensor such as a thermistor supplied as a chip part is mounted on the substrate that constitutes a thermoelectric conversion device. Also, there is no necessity that a temperature sensor is connected directly to an external through a surface the temperature thereof is to be adjusted of the thermoelectric conversion device, thereby being capable of adjusting the temperature at the thermoelectric conversion device.

Also, because semiconductor substrates are used for the substrates that form the thermoelectric conversion device, the substrate of the thermoelectric conversion device can be formed using the established semiconductor process.

Further, because the control circuit is integrated with the other substrate opposed to the substrate on which the temperature sensor is formed on the same plane as the thermoelectric element joint electrode, there is not required that a lead wire is drawn around for connection.

Still further, it is structured such that: an input/output terminal of the temperature sensor and the sensor circuit are connected to each other; the sensor circuit is connected to a power supply line and a grounded line; an output terminal of the sensor circuit and an input terminal of the thermoelectric conversion device drive circuit are connected to each other; the thermoelectric conversion device drive circuit is connected to the power supply line and the grounded line; and an output terminal of the thermoelectric conversion device drive circuit and the thermoelectric conversion device are connected. Accordingly, the control circuit can control the temperature of the thermoelectric conversion device in an analog fashion.

Yet still further, it is structured such that: an input/output terminal of the temperature sensor and the sensor circuit are connected to each other; the sensor circuit is connected to a power supply line and a grounded line; an output terminal of the sensor circuit and an input terminal of a voltage detecting device are connected to each other; the voltage detecting circuit is connected to the power supply line and the grounded line; an output terminal of the voltage detecting circuit and an input terminal of the thermoelectric conversion device drive circuit are connected to each other; the thermoelectric conversion device drive circuit is connected to the power supply line and the grounded line; and an output terminal of the thermoelectric conversion device drive circuit and the thermoelectric conversion device are connected to each other. Accordingly, the control circuit can digitally control the temperature of the thermoelectric conversion device.

Yet still further, because a resistor, a diode or a transistor is used for the temperature sensor, the temperature sensor can be manufactured on the substrate when manufacturing the substrate of the thermoelectric conversion device, thereby being capable of forming a high-sensitive temperature sensor.

The above and other objects and features of the present invention will be more apparent from the following description taken in conjunction with the accompanying drawings.

DETAILED DESCRIPTION OF THE PREFERRED EMBODIMENTS

Figure 1:
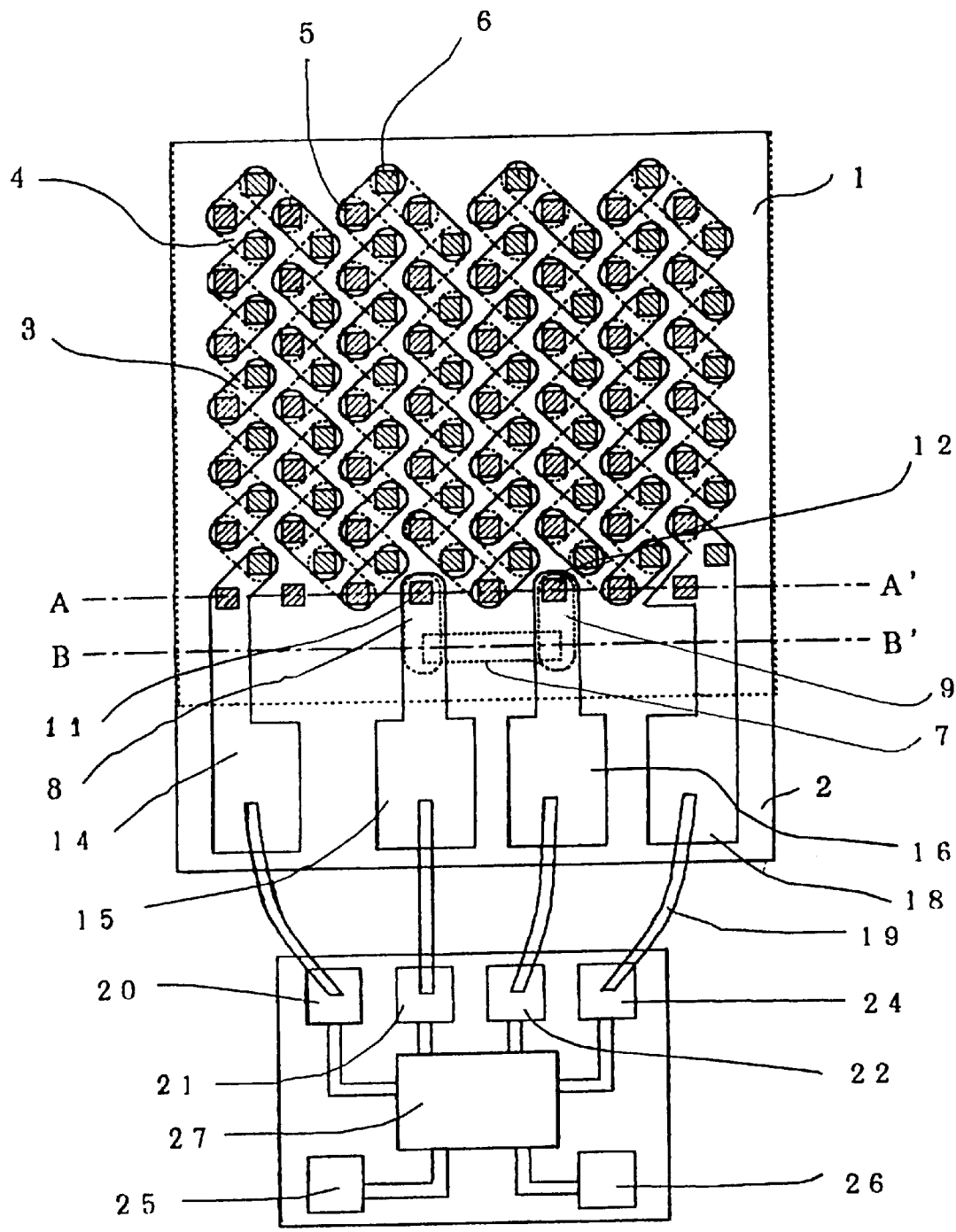
FIG. 1 is a diagram showing the positional relationships of the respective parts on a plane in parallel with a substrate surface of a thermoelectric conversion device in a cooling unit according to an embodiment 1 of the present invention, that is, an arrangement of the main part perspectively viewed from a substrate top surface.

The cooling unit of the present invention is structured such that: a temperature sensor is formed on at least one of substrates that form a thermoelectric conversion device to which thermoelectric elements are connected; an input/output electrode extending from said temperature sensor and an electrode formed on the other surface opposed to the substrate on which the temperature sensor is formed are connected to each other by electrically conductive material; and a control circuit for controlling a current supplied to the thermoelectric conversion device according to an output of the temperature sensor is connected thereto. With this structure, only one surface of the substrate is subjected to a manufacturing process which is very advantageous in the mounting operability, etc. in comparison with a case in which the temperature sensor is mounted on the opposite surface. Accordingly, there is no necessity that a temperature sensor such as a thermistor that is supplied as a chip part is mounted on the substrate that constitutes a thermoelectric conversion device. Also, there is no necessity that a temperature sensor is connected directly to the external on a surface the temperature of which is adjusted of the thermoelectric conversion device so that a thermal load on the surface the temperature of which is adjusted can be reduced, thereby being capable of adjusting the temperature at the thermoelectric conversion device.

Also, the semiconductor substrates are used for the substrates that form the thermoelectric conversion device. For that reason, the substrate of the thermoelectric conversion device can be formed using the established semiconductor process. In particular, in a very small thermoelectric conversion device such that thermoelectric material chips of several tens to several hundred are joined to the substrate of about several mm square, using the method of manufacturing the thermoelectric conversion device as disclosed in Japanese Patent Application Laid-open No. Hei 8-97472, a large number of thermoelectric conversion devices can be prepared from a single substrate. At the same time, the temperature sensor using the semiconductor characteristic and the control circuit are also prepared at the time of manufacturing the substrate of the thermoelectric conversion device, thereby being capable of manufacturing the cooling unit with easy and at the low costs.

Further, the control circuit is integrated with the other substrate opposed to the substrate on which the temperature sensor is formed on the same plane as the thermoelectric element joint electrode. Therefore, the mounting process is reduced to lower the costs. In particular, in the thermoelectric conversion device that is small such as about several mm square, the scale merits can be exhibited by the integration of the control circuit. Also, because the temperature sensor and the control circuit are formed on the substrate during the same process, the matching of the temperature sensor and the control circuit becomes excellent to reduce the examination process.

Still further, the control circuit is designed such that: an input/output terminal of the temperature sensor and the sensor circuit are connected to each other; the sensor circuit is connected to a power supply line and a grounded line; an output terminal of the sensor circuit and an input terminal of the thermoelectric conversion device drive circuit are connected to each other; the thermoelectric conversion device drive circuit is connected to the power supply line and the grounded line; and an output terminal of the thermoelectric conversion device drive circuit and the thermoelectric conversion device are connected. With this structure, the temperature of the thermoelectric conversion device is controlled in an analog fashion, thereby being capable of preventing an object to be adjusted in temperature which is in contact with the surface the temperature of which is adjusted of the thermoelectric conversion device from being adversely affected by noises caused by on/off of the drive current of the thermoelectric conversion device.

Yet still further, the control circuit is designed in such -a manner that: an input/output terminal of the temperature sensor and the sensor circuit are connected to each other; the sensor circuit is connected to a power supply line and a grounded line; an output terminal of the sensor circuit and an input terminal of a voltage detecting circuit are connected to each other; the voltage detecting circuit is connected to the power supply line and the grounded line; an output terminal of the voltage detecting circuit and an input terminal of the thermoelectric conversion device drive circuit are connected to each other; the thermoelectric conversion device drive circuit is connected to the power supply line and the grounded line; and an output terminal of the thermoelectric conversion device drive circuit and the thermoelectric conversion device are connected to each other. With this structure, since the temperature of the thermoelectric conversion device is digitally controlled so that the thermoelectric conversion device is switchingly driven, the temperature control can be performed with a low power consumption. Further, because the temperature is detected using the voltage detecting circuit, an error in the characteristics of the temperature sensor is facilitated.

Yet still further, a resistor, a diode or a transistor is used for the temperature sensor. With this structure, the temperature sensor can be mounted on the substrate at the time of manufacturing the substrate of the thermoelectric conversion device, thereby being capable of reducing the costs. Also, since the resistor, the diode and the transistor are formed using the semiconductor process, a high-sensitive temperature sensor can be formed, thereby being capable of adjusting the temperature of the thermoelectric conversion device high in the accuracy of temperature.

Now, a description will be given in more detail of preferred embodiments of the present invention with reference to the accompanying drawings.

Embodiment 1

FIG. 1 is a diagram showing the positional relationships of the respective parts on a plane in parallel with a substrate surface of a thermoelectric conversion device in a cooling unit according to an embodiment 1 of the present invention, that is, an arrangement of the main part perspectively viewed from a substrate top surface. The basic structure of the thermoelectric conversion device according to the present invention has the same structure as the conventional one which is called "-type element", and is arranged in such a manner that a plurality of thermoelectric elements 5 each made of a p-type Bi—Te thermoelectric material chip and a plurality of n-type thermoelectric elements 6 each made of an n-type Bi—Te thermoelectric material chip are alternately connected to each other in series through a plurality of lower p-n junction electrodes 3 and a plurality of upper p-n junction electrodes 4 formed on a lower substrate 2 and an upper substrate 1, respectively. Although there is no upper and lower substrates of the thermoelectric conversion device, in the present specification, for convenience of explanation of this embodiment, the upper and lower substrates are defined. On the lower substrate 2 are provided thermoelectric conversion device side drive terminals 14, 18 and temperature sensor terminals 15, 16. In this embodiment, a temperature sensor 7 is formed on the same plane as the upper p-n junction electrodes 4 on the upper substrate 1. The temperature sensor 7 includes electrodes 8 and 9 for outputting temperature measurement information and is connected to temperature sensor terminals 15 and 16 disposed on the lower substrate 2 through connection bodies 11 and 12 made of electrically conductive material. The connection bodies 11 and 12 are formed of the p-type thermoelectric elements 5 which are a material of the thermoelectric elements that constitute the thermoelectric conversion device. The connection bodies 11 and 12 are manufactured simultaneously when the p-type thermoelectric elements are manufactured. The manufacture of the connection bodies 11 and 12 are completely integrated with a basic manufacturing process of the thermoelectric conversion device.

Figure 2:
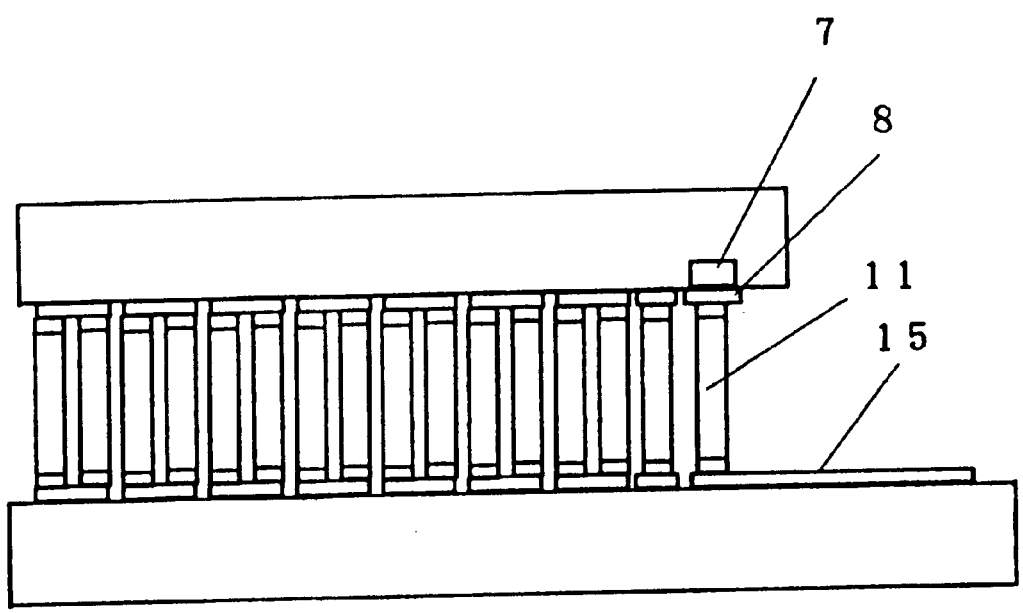
FIG. 2 is a diagram showing the positional relationships of the respective parts on a plane perpendicular to a substrate surface of a thermoelectric conversion device of a cooling unit according to an embodiment 1 of the present invention, that is, an arrangement of the main part viewed from a substrate side surface.
Figure 3:
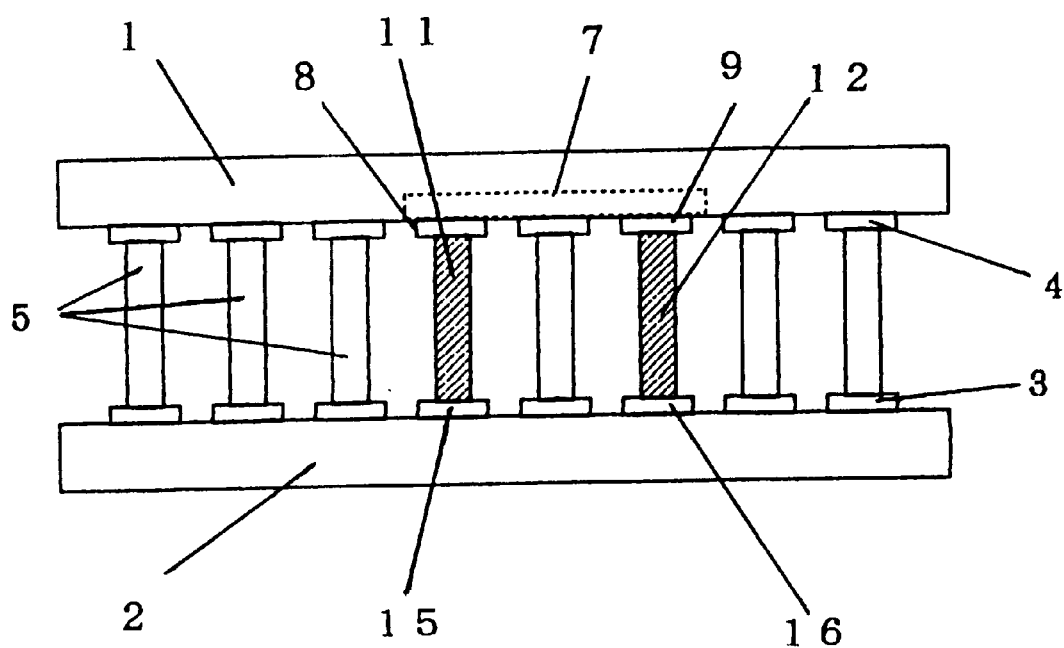
FIG. 3 is a vertical cross-sectional view taken along a dashed line B–B' of FIG. 1.

Also, the thermoelectric conversion device is connected to a control circuit 27 by a wire bonding. The temperature sensor terminals 15 and 16 are connected to input terminals 21 and 22 of the control circuit through a wire 19, and thermoelectric conversion device side drive terminals 14 and 18 are connected to control circuit side drive terminals 20 and 24 through the wire 19. A power is supplied to the thermoelectric conversion device, the temperature sensor 7 and the control circuit 27 by connecting an external power supply to a power supply line terminal 25 and a grounded line terminal 26. FIG. 2 is a side view of the thermoelectric conversion device according to the present invention, and FIG. 3 is a vertical cross-sectional view taken along a dashed line A–A' of FIG. 1. As shown in FIG. 2, the p-type thermoelectric elements 5 and the n-type thermoelectric elements 6 are alternately connected to each other in series through the lower p-n junction electrodes 3 and the upper p-n junction electrodes 4. Also, the temperature sensor 7 is formed on the same plane as upper p-n junction electrode 4 on the upper substrate 1. As shown in FIG. 3, the temperature sensor 7 includes electrodes 8 and 9 for outputting temperature measurement information and is connected to temperature sensor terminals 15 and 16 disposed on the lower substrate 2 through connection bodies 11 and 12 made of electrically conductive material. The connection bodies 11 and 12 are formed of the p-type thermoelectric elements 5 which are a material of the thermoelectric elements that constitute the thermoelectric conversion device. The connection bodies 11 and 12 are manufactured simultaneously when the p-type thermoelectric element is manufactured. The manufacture of the connection bodies 11 and 12 are completely integrated with a basic manufacturing process of the thermoelectric conversion device.

Hereinafter, a description will be given of the operation of a cooling unit according to this embodiment.

A surface of the upper substrate 1 opposite to a surface thereof on which the upper p-n junction electrode 4 is formed is set as a temperature adjustment surface, and the temperature of an upper substrate 1 is measured by the temperature sensor 7 formed on the same surface side where the upper p-n junction electrode 4 is formed. The output of the temperature sensor 7 is inputted to the control circuit 27 through the connection bodies 11, 12 made of electrically conductive material, the temperature sensor terminals 15, 16 disposed on the lower substrate 2, the wire 19 and the control circuit input terminals 21, 22. The association of the output signal of the temperature sensor 7 with the absolute temperature is adjusted to some degree at a stage where the control circuit is designed, and then finely adjusted at the control circuit 27 side after thermoelectric conversion device and the control circuit 27 are completely connected to each other. When the temperature of the upper substrate 1 is shifted from a desired temperature, the control circuit 27 supplies a current to the thermoelectric conversion device through the control circuit side drive terminals 20, 24, the wire 19, and the thermoelectric conversion device side drive terminals 14, 18. In the case where the temperature of the upper substrate 1 reaches the desired temperature, the current that is supplied to the thermoelectric conversion device is cut off or weakened so as to be kept a given temperature.

Figure 4:
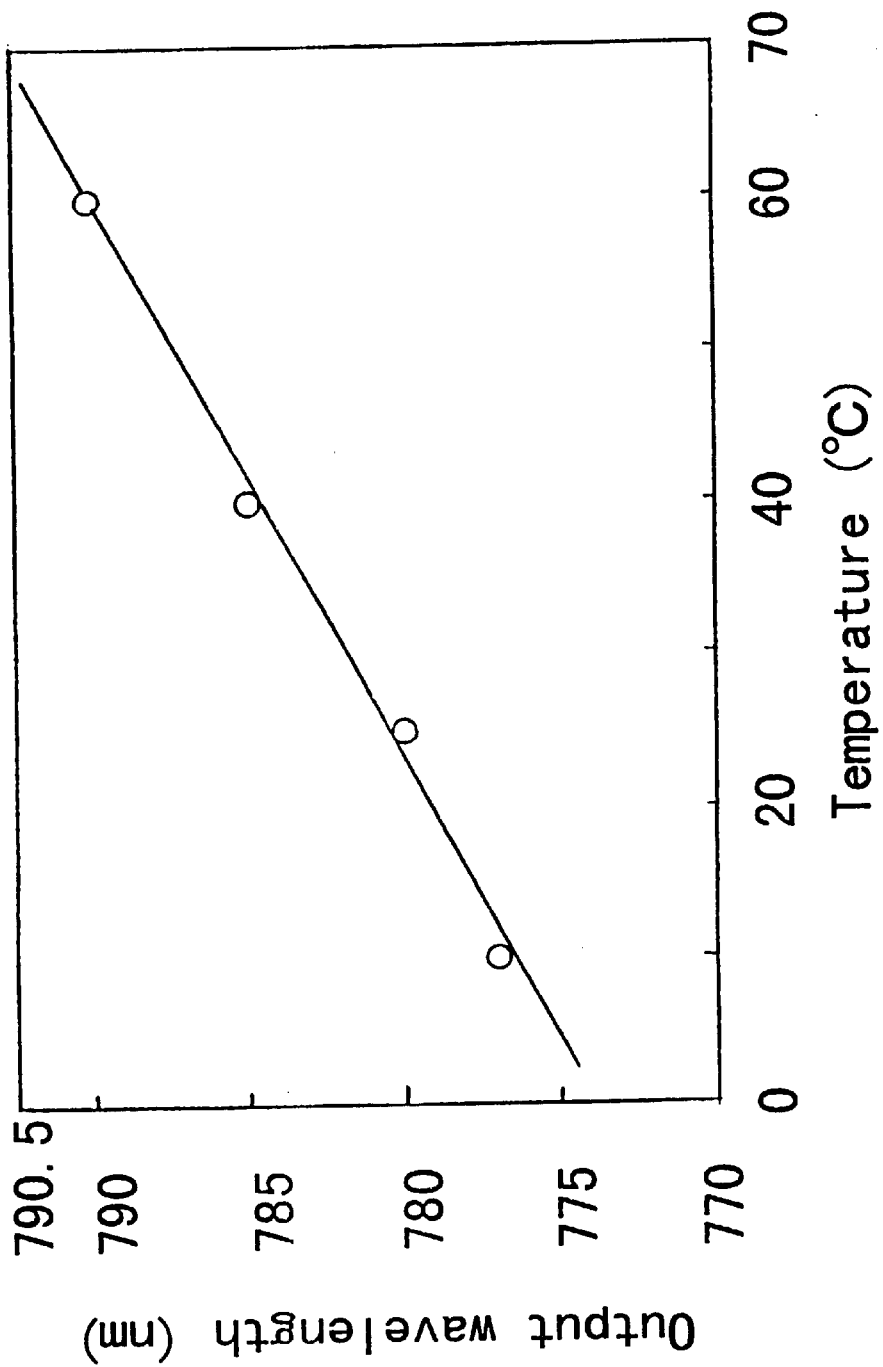
FIG. 4 is a graph showing a change in output wavelength to a semiconductor laser temperature.

In the cooling unit according to the present invention, there is no necessity that parts for detection of a temperature are mounted on the upper substrate 1 because the temperature sensor 7 is integrated with the upper substrate. Also, because a surface on which the temperature sensor 7 is disposed is a surface to which the elements of the thermoelectric conversion device are joined, the input/output electrode of the temperature sensor 7 can be directly made of the conductive material, that is, the same material as the thermoelectric elements used as the thermoelectric conversion device. As a result, what is subjected to a manufacturing process is only one surface of the substrate, resulting in a great advantage of the operability and so on in comparison with a case in which the temperature sensor 7 is formed on the surface the temperature of which is adjusted. Further, because the temperature sensor 7 is connected to the electrode of the lower substrate 2 through the electrodes 8 and 9 for outputting the temperature measurement information and the connection bodies 11 and 12 which are made of the electrically conductive material, a thermal load on the surface the temperature of which is adjusted of the thermoelectric conversion device, which is caused by the external temperature sensor and the lead wire, can be reduced. Moreover, because the control circuit 27 is connected to the thermoelectric conversion device, the surface the temperature of which is adjusted of the thermoelectric conversion device can be finely controlled in temperature. In particular, the semiconductor laser used for optical communication, etc., is caused to largely vary its output wavelength as the temperature of the semiconductor laser is changed. For example, the output characteristic of the semiconductor laser diode 780 nm in output wavelength to temperature is such that the output wavelength is changed about 15 nm with a change of the temperature from 10° C. to 60° C., as shown in FIG. 4. In the semiconductor of this type, the use of the cooling device according to this embodiment enables a stable output wavelength to be obtained since the temperature is finely controlled and the temperature of the semiconductor laser is kept constant.

Also, in this embodiment, the temperature sensor 7 is integrated with the upper substrate 1. In addition, if the temperature sensor 7 is also integrated with the lower substrate 2, the temperature can be more accurately adjusted. In particular, up to now, the measurement accuracy of the physical constant of the thermoelectric conversion device per se, for example, the Seebeck coefficient, and so on was large in error due to the thermal load due to the external temperature sensor 7 and the lead wire. However, in the thermoelectric conversion device according to the present invention, more accurate measurement is enabled.

Embodiment 2

A description will be given of a cooling unit in which the upper substrate 1 and the lower substrate 2 of the thermoelectric conversion device are formed of semiconductor substrates according to Embodiment 2.

It is very difficult or impossible to manufacture a micro thermoelectric conversion device designed such that the thermoelectric material of which the thermoelectric conversion device is made, the thermoelectric elements are 120 $\mu$m×120 $\mu$m in size, 600 $\mu$m in height, and 102 in the number of elements (51 p-n pairs), and the outer dimensions of the device is 3 mm×3 mm and the thickness thereof is about 1.3 mm, in a method in which the elements are allowed to be sandwiched between the substrates using a jig or the like as in the prior art. Under this circumstance, the semiconductor substrates are used for those substrates of the thermoelectric conversion device, thereby being capable of employing a stabilized semiconductor process, and the temperature adjustment control device of the thermoelectric conversion device and the temperature sensor using the semiconductor characteristic are integrated on the same substrate at the same time when the electrodes or the like on the substrate is manufactured.

Further, alumina or the like has been conventionally used for the substrate of the thermoelectric conversion device. Instead, silicon which is semiconductor material is used for the substrates, to thereby remarkably improve the thermal conductivity of the substrate. The thermal conductivity of alumina is 30 to 40 W/m·K at a room temperature whereas that of silicon is 80 W/m·K which is very high. Further, alumina is 11.9 $mm^2$/s in thermal diffusivity whereas silicon 53 $mm^2$/s which is very high in thermal diffusivity and also improved in cooling effect of the thermoelectric conversion device. Also, When the temperature sensor is mounted on a surface opposite to the surface the temperature of which is adjusted, it is presumed that a temperature difference occurs between the surface the temperature of which is adjusted and the opposite surface so that the temperature is not accurately measured. However, as described above, if silicon is used for the substrate of the thermoelectric conversion device, because both of the thermal conductivity and the thermal diffusivity are very high, even though the temperature sensor is mounted on the surface opposite to the surface the temperature of which is adjusted, the temperature of the surface the temperature of which is adjusted can be accurately measured.

Figure 5:
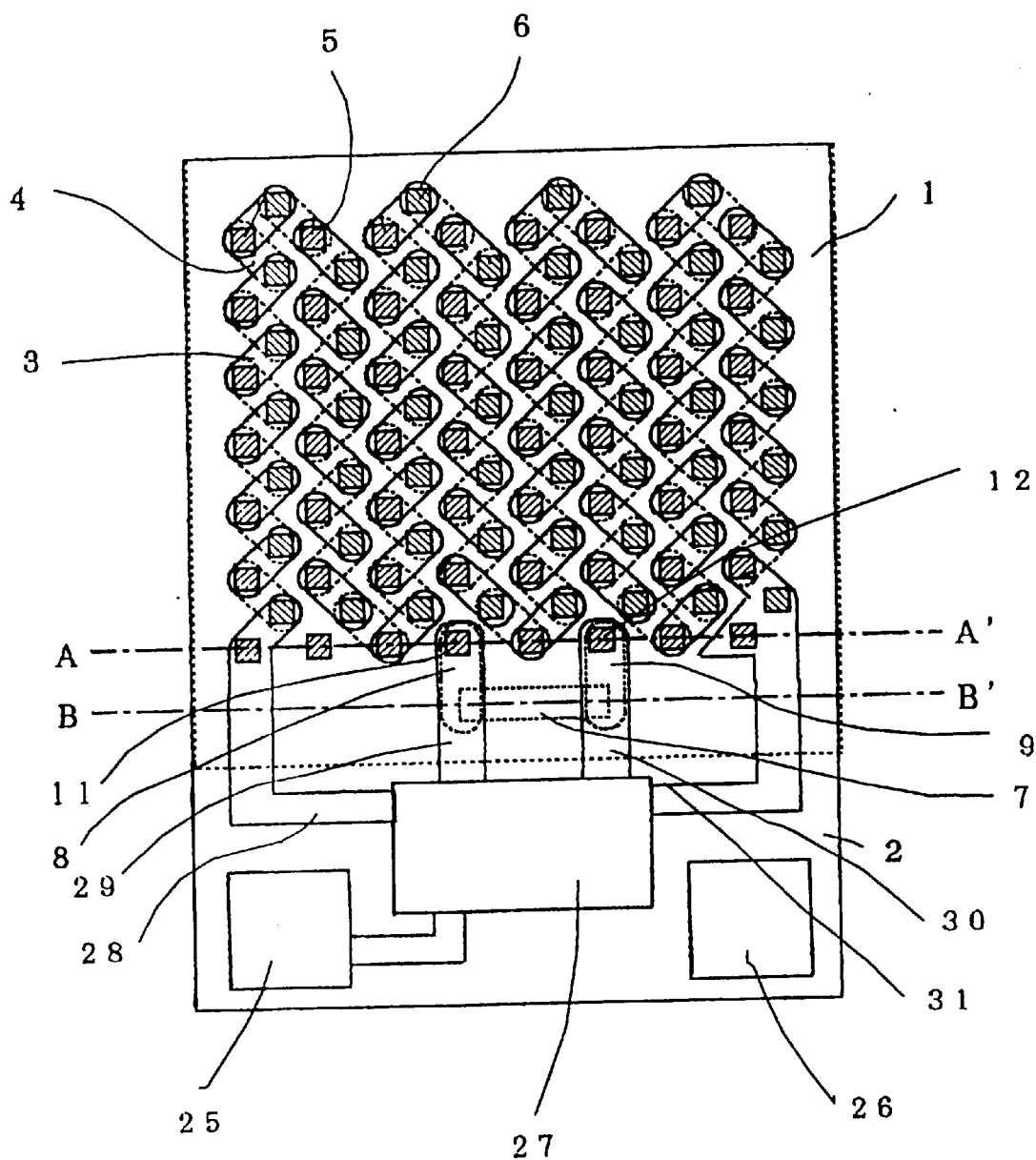
FIG. 5 is a diagram showing the positional relationship of the respective parts on a plane in parallel with a substrate surface of a thermoelectric conversion device in a cooling unit according to an embodiment 2 of the present invention, that is, an arrangement of the main part perspectively viewed from a substrate top surface.

Hereinafter a cooling unit in which the control circuit is integrated with the lower substrate 2 will be described with reference to FIG. 5. The structure of the thermoelectric conversion device and the temperature sensor 7 is identical with that of Embodiment 1. The temperature sensor 7 is connected to temperature sensor lines 29 and 30 disposed on the lower substrate 2 through the electrodes 8 and 9 for outputting the temperature measurement information and the connection bodies 11 and 12 which are made of an electrically conductive material. A signal from the temperature sensor 7 is inputted to the control circuit 27 through the temperature sensor lines 29 and 30, and a current for driving the thermoelectric conversion device is outputted from the control circuit 27 through the thermoelectric conversion device drive lines 28 and 31. A power is supplied to the thermoelectric conversion device, the temperature sensor 7 and the control circuit 27 by connection of the power supply line terminal 25 and the grounded line terminal 26 to the external power supply.

Figure 6:
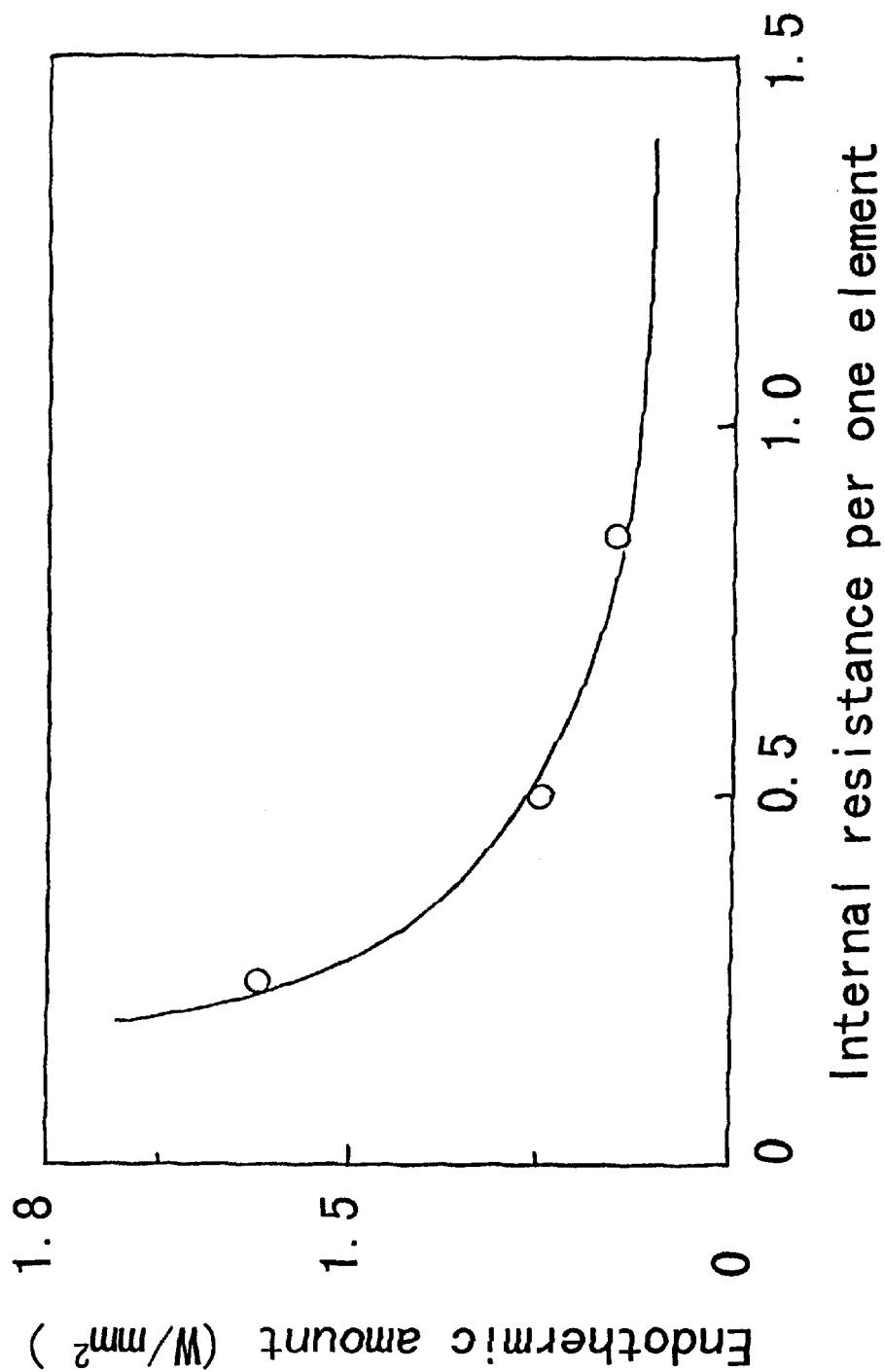
FIG. 6 is a graph showing the relationship of the endothermic amount to the internal resistance per one thermoelectric element.

Also, in this embodiment, the internal resistance per one thermoelectric element is set to 0.1 to 1,000 Ω. In the conventional thermoelectric conversion device, a current of several A is required when the drive voltage is several V. At this time, since the number of thermoelectric elements is several to several tens, the internal resistance per one thermoelectric element becomes 0.002 to 0.04 Ω. However, in the case where the drive circuit of the thermoelectric conversion device is integrated with the semiconductor device which is a substrate of the thermoelectric conversion device, because a current of several A flows therein, the substrate is heated. As a result, the control circuit is not operated, or the control circuit or the drive circuit using the CMOS circuits cannot be used because the drive capacity is limited. Therefore, the internal resistance per one thermoelectric element is set to 0.1 Ω or more. Also, although the thermoelectric conversion device increases the cooling endothermic amount in proportion to a flowing current, because the Joule heat due to the specific resistance of the thermoelectric element increases in proportion to square of a current, the endothermic amount decreases more as the specific resistance of the thermoelectric element increase as shown in FIG. 6. Moreover, as the thermoelectric element is made slender to increase the specific resistance, the machining limit is exhibited. Hence, since the thermoelectric element using the Bi—Te thermoelectric material is about 1 mΩ·cm in specific resistance, and the machining limit is 0.4 or more in aspect ratio of the cross-sectional area of the thermoelectric element to the length thereof, the internal resistance of the thermoelectric element is 1,000 Ω or less.

An operating method of the cooling unit according to Embodiment 2 is that, as in Embodiment 1, a surface opposite to the surface on which the upper p-n junction electrode 4 of the upper substrate 1 is formed is a surface the temperature of which is adjusted, and the temperature of the upper substrate 1 is measured by the temperature sensor 7 formed on the surface on which the upper p-n junction electrode 4 is formed. When the temperature of the upper substrate 1 is shifted from a desired temperature, the control circuit 27 supplies a current to the thermoelectric conversion device through the thermoelectric conversion device drive lines 28 and 31. In the case where the temperature of the upper substrate 1 reaches the desired temperature, a current that is supplied to the thermoelectric conversion device is cut off or weakened so that the temperature is kept constant.

In addition to the advantages obtained by Embodiment 1 of the present invention, the cooling unit according to this embodiment is effective, in particular, to a micro thermoelectric conversion device designed such that the thermoelectric elements are 120 μm×120 μm in size, 600 μm in height, and 102 in the number of elements (51 p-n pairs), and the outer dimensions of the device is 3 mm×3 mm and the thickness thereof is about 1.3 mm. The micro thermoelectric conversion device has a merit of cooling a fine object. However, when the drive control circuit is externally equipped, a space is taken so that the merit of downsizing is not exhibited. However, the cooling unit of this embodiment has the control circuit within the substrate of the thermoelectric conversion device, thereby exhibiting the merit of downsizing. Further, in the micro thermoelectric conversion device, it is not easy to mount it on the cooling unit, whereas the cooling unit of this embodiment can contribute to a reduction in a process of mounting the thermoelectric conversion device on the cooling unit.

Embodiment 3

A description will be given of a cooling unit using a resistor 45 in a temperature sensor according to Embodiment 3.

A diffusion resistor or a polysilicon resistor which are manufactured using the semiconductor process are employed as the temperature sensor 7 so that a variation in resistance to temperature is used as a sensor. Because a variation in temperature becomes larger as the diffusion resistor or the polysilicon resistor is large in resistivity, it is preferable that the resistivity is higher. Also, since the specific resistance of the diffusion resistor is determined by the concentration of the semiconductor substrate to a certain extent, the polysilicon resistor is more preferable as the temperature sensor because it can control the resistivity by the amount of implanted ions. The polysilicon resistor is manufactured in such a manner that 5E14 ions are implanted into polysilicon 0.35 μm in thickness to provide the specific resistance 5 to 10 kΩ per unit length.

A description will be given of a cooling unit that controls the temperature of the thermoelectric conversion device in an analog fashion, using a resistor 45 in the temperature sensor 7. Both ends of the semiconductor diffusion resistor or the polysilicon resistor 45 are connected to the electrodes 8 and 9 for outputting temperature measurement information which are metal electrodes, etc. and then connected to the temperature sensor terminals 15 and 16 disposed on the lower substrate 2 through the connection bodies 11 and 12 formed of the thermoelectric elements. The temperature sensor terminals 15 and 16 are connected to the control circuit input terminals 21 and 22 by wire bonding so that a sensor signal is inputted to the control circuit. In this example, when the control circuit 27 of Embodiment 2 is integrated with the lower substrate 2, both ends of the resistor 45 are connected to the electrodes 8 and 9 for outputting the temperature measurement information, and then connected to the control circuit 27 through connection bodies 11 and 12 formed of the thermoelectric elements and the temperature sensor lines 29 and 30 disposed on the lower substrate 2. A power is supplied from the external power supply to the temperature sensor 7, the control circuit 27 and the thermoelectric conversion device through the power supply line terminal 25 and the grounded line terminal 26.

Figure 7:
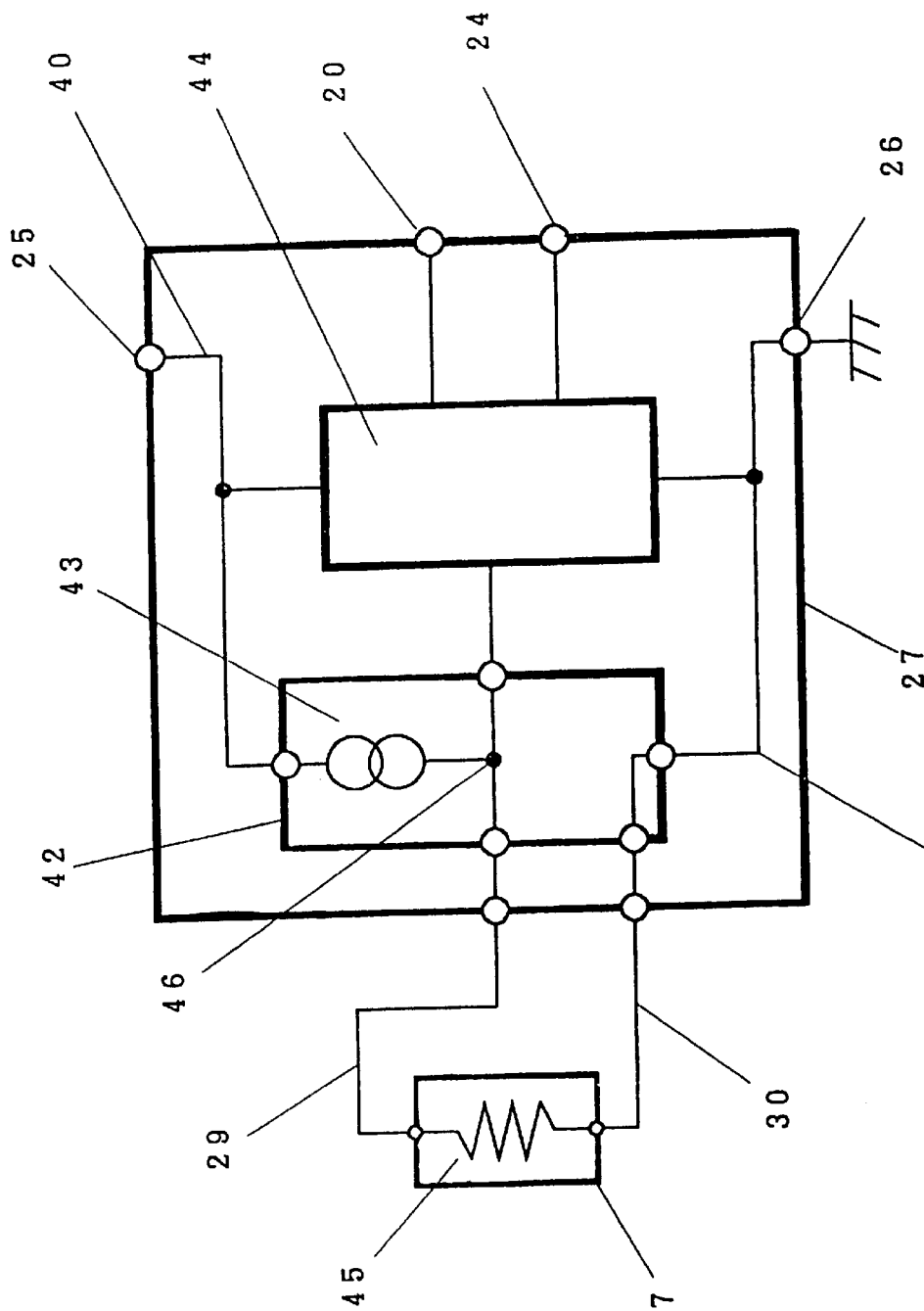
FIG. 7 is a diagram showing the structure of a temperature sensor and a control circuit in a cooling unit according to an embodiment 3 of the present invention.

Hereinafter, a case in which the control circuit 27 of Embodiment 2 is integrated with the lower substrate 2 will be described. The control circuit 27 is made up of the sensor circuit 42 and the thermoelectric conversion device drive circuit 44 that are connected as shown in FIG. 7. The sensor circuit 42 is formed of a constant-current circuit 43 that supplies a constant current to the resistor 45. The constant-current circuit 43 is made up of, for example, one depletion type MOS transistor. The constant-current circuit 43 within the sensor circuit 42 is designed such that an input terminal thereof is connected to the power supply line 40 whereas an output terminal thereof is connected to one terminal of the resistor 45 through the temperature sensor line 29. Another terminal of the resistor 45 is connected to a grounded line 41 through the temperature sensor line 30. Further, a node connecting the constant-current circuit 43 and the resistor 45 is connected to an input terminal of the thermoelectric conversion device drive circuit 44. The thermoelectric conversion device drive circuit 44 is, for example, a circuit consisting of a MOS transistor or a bipolar transistor. The thermoelectric conversion drive circuit 44 is connected to the power supply line 40 and the grounded line 41, and an output of the thermoelectric conversion device drive circuit 44 is connected to the thermoelectric drive lines 28 and 31 to drive the thermoelectric conversion device. A power is supplied to the temperature sensor 7, the control circuit 27 and the thermoelectric conversion device from the external power supply through the power supply line terminal 25 and the grounded line terminal 26.

The principle of the operation according to this embodiment is that since the resistance of the resistor 45 is varied with a change in temperature, a voltage value on a node 46 connecting the constant-current circuit 43 and the resistor 45 is varied when a constant current is supplied to the resistor 45 by the a constant-current circuit 43. The thermoelectric conversion device drive circuit 44 receives the change in the voltage value, for example, the gate electrode of the MOS transistor receives the change in the voltage value, to thereby control the thermoelectric device drive current in an analog fashion. When the temperature of the surface the temperature of which is adjusted reaches the desired temperature, the threshold voltage of the transistor in the thermoelectric device drive circuit 44 and the resistance of the resistor 45 are set so that the thermoelectric device drive current gets minimum or is prevented from flowing. This setting can be varied by changing the concentration of implanted ions. However, since the set temperature cannot be changed after the substrate is manufactured, the set temperature of the surface the temperature of which is adjusted must be determined in advance. However, if a method is taken in which a plurality of resistors 45 are prepared, and the resistor is fusedly cut according to the set temperature of the surface the temperature of which is adjusted, or the like, the set temperature can be changed even after the substrate of the thermoelectric conversion device is manufactured.

With the above structure, the temperature control of the thermoelectric conversion device is controlled in an analog manner, thereby being capable of preventing an object to be adjusted in temperature which is in contact with the surface the temperature of which is adjusted of the thermoelectric conversion device from being adversely affected by noises caused by on/off of the drive current of the thermoelectric conversion device. This is to solve such a problem that noises caused when electricity is switchingly supplied to the thermoelectric conversion device for the purpose of setting the temperature of the surface the temperature of which is adjusted to the desired temperature adversely affects communication.

Embodiment 4

A description will be given of a cooling unit for digitally controlling the temperature of the thermoelectric conversion device using the resistor 45 in the temperature sensor 7 according to Embodiment 4 of the present invention. The following description will be given on the basis of a cooling unit in which the control circuit 27 is integrated with the substrate of the thermoelectric conversion device.

Figure 8:
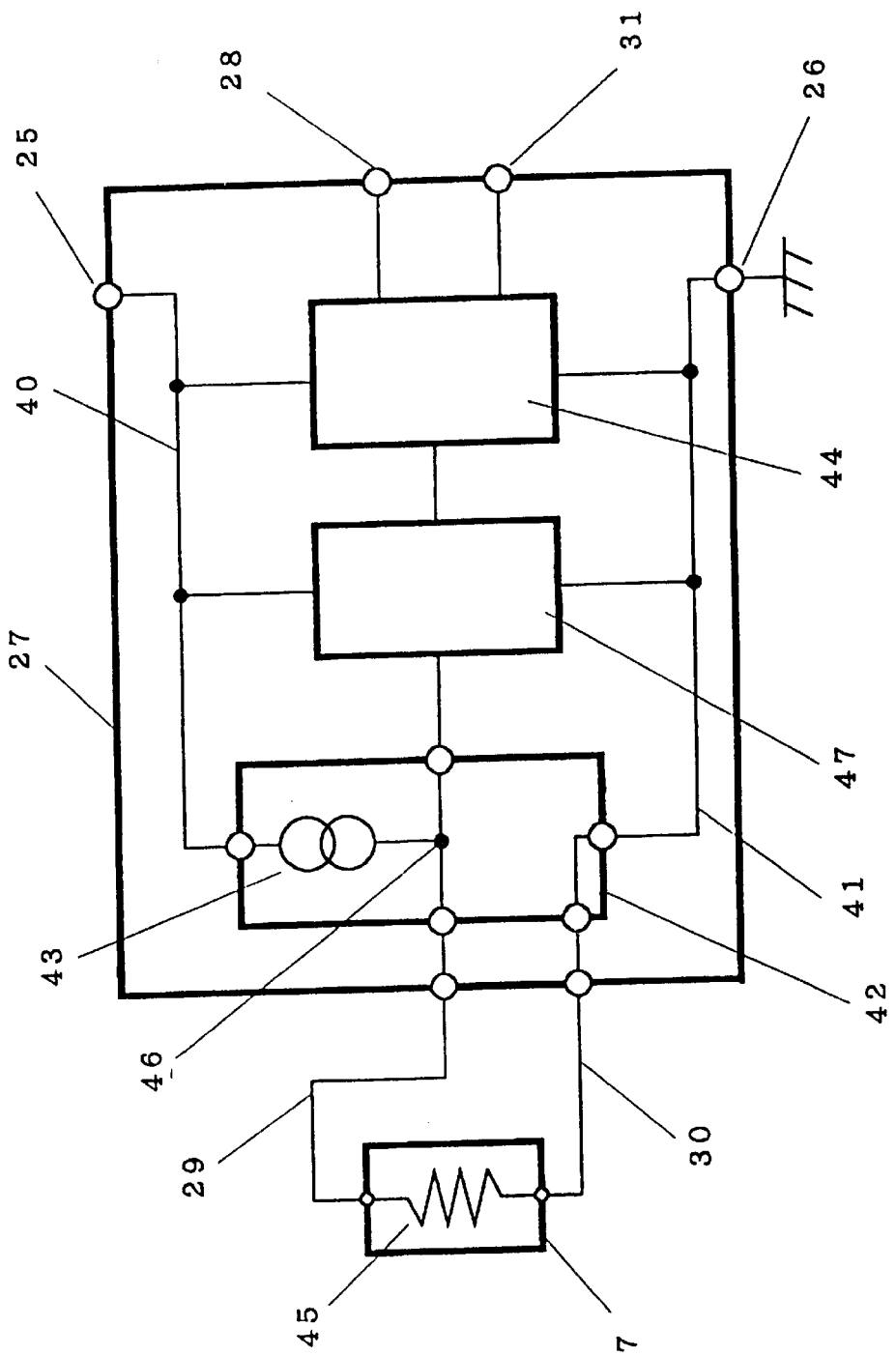
FIG. 8 is a diagram showing the structure of a temperature sensor and a control circuit in a cooling unit according to an embodiment 4 of the present invention.

A manner of connecting the resistor 45 and the control circuit 27 is the same as that in Embodiment 3. The control circuit 27 is made up of the sensor circuit 42, a voltage detecting circuit 47 and the thermoelectric conversion device drive circuit 44 that are connected as shown in FIG. 8. The sensor circuit 42 is formed of a constant-current circuit 43 that supplies a constant current to the resistor 45. The constant-current circuit 43 is made up of, for example, one depletion type MOS transistor. The constant-current circuit 43 within the sensor circuit 42 is designed such that an input terminal thereof is connected to the power supply line 40 whereas an output terminal thereof is connected to one terminal of the resistor 45 through the temperature sensor line 29. Another terminal of the resistor 45 is connected to a grounded line 41 through the temperature sensor line 30. Further, a node 46 connecting the constant-current circuit 43 and the resistor 45 is connected to an input terminal of the voltage detecting circuit 47. The voltage detecting circuit 47 is, for example, a circuit consisting of a MOS transistor. The voltage detecting circuit 47 is connected to the power supply line 40 and the grounded line 41, and an output of the voltage detecting circuit 47 is connected to an input of the thermoelectric drive circuit 44. The thermoelectric conversion device drive circuit 44 is, for example, a circuit consisting of a MOS transistor or a bipolar transistor. The thermoelectric conversion device drive circuit 44 is connected to the power supply line 40 and the grounded line 41, and an output of the thermoelectric conversion device drive circuit 44 is connected to the thermoelectric device drive lines 28 and 31 so as to drive the thermoelectric conversion device. A power is supplied to the temperature sensor 7, the control circuit 27 and the thermoelectric conversion device from the external power supply through the power supply line terminal 25 and the grounded line terminal 26.

The principle of the operation according to this embodiment is that a change in resistance caused by changing the temperature of the resistor 45 is converted into a change in voltage value by connection of the constant-current circuit 43 to the resistor 45. The voltage detecting circuit 47 receives the change in the voltage value, and when the voltage value becomes the set voltage, that is, the temperature of the surface to be adjusted becomes the set temperature, a signal to the thermoelectric conversion device drive circuit 44 is cut off. Because the signal from the voltage detecting circuit 47 is cut off, the thermoelectric conversion device drive circuit 44 cuts off the supply of a current to the thermoelectric conversion device to stop temperature adjustment. For example, in the case where the resistor 45 is a polysilicon resistor doped with phosphorus, and the temperature of the surface the temperature of which is adjusted rises and exceeds the set temperature, since the resistance of the polysilicon resistor is lowered, the voltage which is inputted to the voltage detecting circuit 47 is also lowered. In this situation, the voltage detecting circuit 47 outputs the signal to the thermoelectric conversion device drive circuit 44 to drive the thermoelectric conversion device. Then, when the surface the temperature of which is adjusted becomes lower than the set temperature, the input voltage of the voltage detecting circuit 47 rises, and the voltage detecting circuit 47 cuts off the signal to the thermoelectric conversion device drive circuit 44, as a result of which the drive current to the thermoelectric conversion device is cut off to stop cooling. Since this process is repeated, the thermoelectric conversion device is switchingly controlled.

The temperature setting of the surface the temperature of which is adjusted is conducted by changing the detection voltage of the voltage detecting circuit 47. This setting is that the output voltage from the resistor 45 and the output voltage of the constant voltage circuit within the voltage detecting circuit 47 are measured under the set temperature atmosphere, and the polysilicon resistor within the voltage detecting circuit 47 is trimmed so that those two output voltages coincide with each other. As a result, the output voltage of the temperature sensor 7 at the set temperature is stored. Hence, in the case where the surface the temperature of which is adjusted is changed in temperature, the output voltage from the resistor 45 is different to send a signal to the thermoelectric conversion device drive circuit 44.

With the above structure, the temperature setting of the thermoelectric conversion device is switchingly controlled, thereby being capable of lowering the power consumption of the cooling unit. Also, the setting temperature of the surface the temperature of which is adjusted can be changed after the substrate of the thermoelectric conversion device is manufactured, and then a fluctuation in the resistance of the resistor 45 due to the manufacturing fluctuation can be absorbed by the voltage detecting circuit, thereby being capable of adjusting the temperature with high accuracy.

Embodiment 5

A description will be given of a cooling unit in which the control circuit is integrated with the lower substrate of the thermoelectric conversion device using a diode in the temperature sensor according to Embodiment 5 of the present invention.

Figures 9A, 9B, 9C:
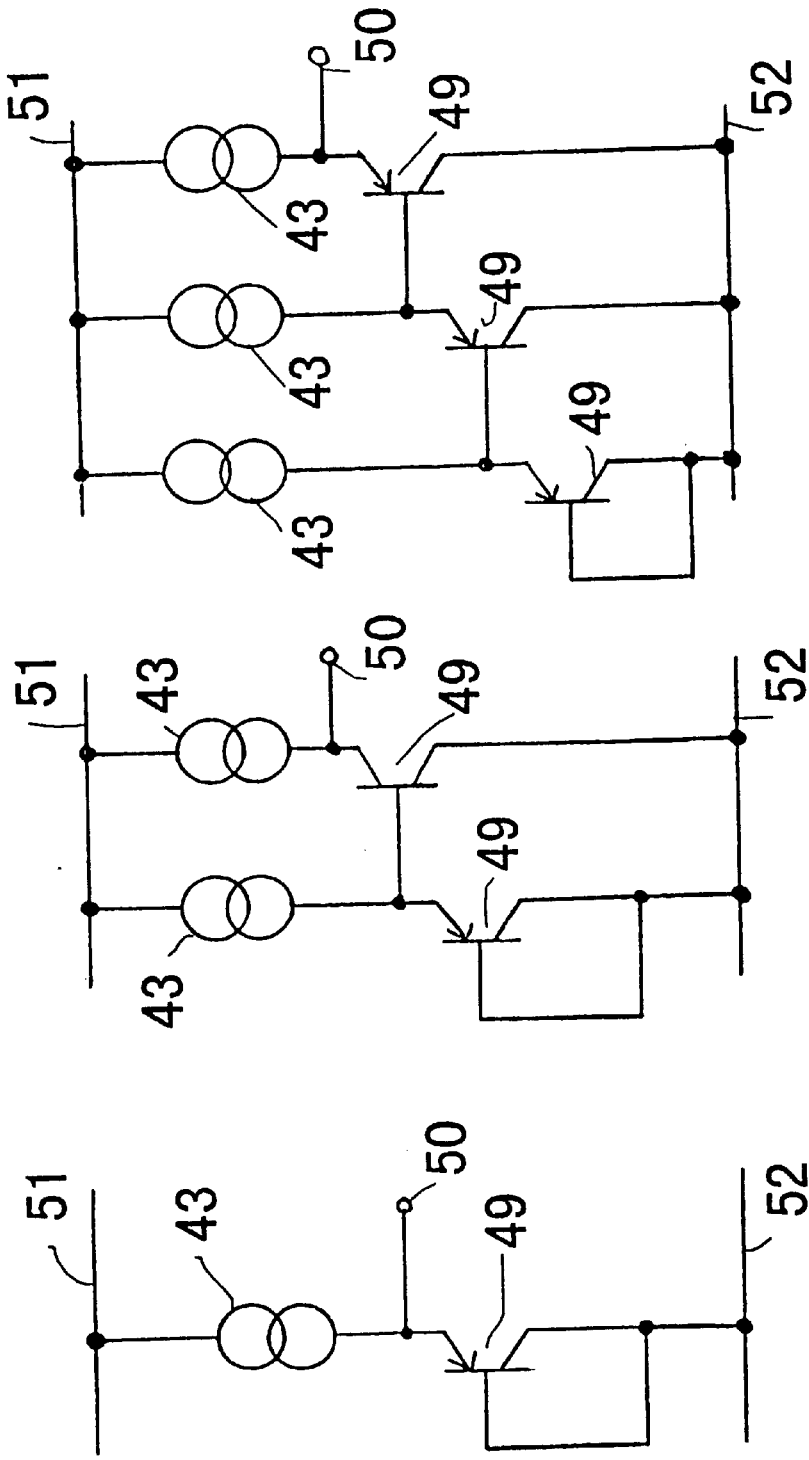
FIGS. 9A, 9B and 9C are diagrams showing the connection of a diode to the temperature sensor in the cooling unit according to embodiments 5 and 6 of the present invention.

Using a diode manufactured through the semiconductor process as the temperature sensor 7, the temperature characteristic of a voltage between the base and the emitter of a p-n-p transistor is employed as a sensor. The p-n-p transistor is effective in a p substrate, but an n-p-n transistor is used on an n substrate to obtain the same effect. FIG. 9A shows a diagram of the connection for measuring a voltage between the base and the emitter of the p-n-p transistor. The power supply line 51 is connected to one terminal of the constant-current circuit 43, and another terminal of the constant-current circuit 43 is connected to an emitter of the p-n-p transistor 49, and the collector of the p-n-p transistor 49 is connected to a grounded line 52. Further, the base and the collector of the p-n-p transistor 49 are connected to each other such that a node 50 at which the constant-current circuit 43 and the emitter of the p-n-p transistor 49 are connected serves as an output terminal of the temperature sensor. Also, as a method of enhancing the sensitivity of the temperature sensor, there is a method in which two (FIG. 9B) or three (FIG. 9C) p-n-p transistors are connected in the Darlington connection manner.

A method of connecting two p-n-p transistors 49 is that, as shown in FIG. 9B, the power supply 51 and one terminal of the constant-current circuit 43 are connected to each other, and another terminal of the constant-current circuit 43 is connected to the emitter of the p-n-p transistor 49, and the collector of the p-n-p transistor 49 is connected to the grounded line 52. Further, the base and the collector of the p-n-p transistor 49 are connected to each other, and a node at which the constant-current circuit 43 and the emitter of the p-n-p transistor 49 are connected is connected to the base of the second p-n-p transistor 49. The second p-n-p transistor 49 has the emitter connected to the constant-current circuit 43 which is connected to the power supply line 51, and the collector is connected to the grounded line 52. Then, the node 50 at which the emitter of the second p-n-p transistor 49 and the constant-current circuit 43 are connected serves as an output terminal of the temperature sensor 7.

Also, a method of connecting three p-n-p transistors 49 is that, as shown in FIG. 9C, the power supply 51 and one terminal of the constant-current circuit 43 are connected to each other, and another terminal of the constant-current circuit 43 is connected to the emitter of the p-n-p transistor 49, and the collector of the p-n-p transistor 49 is connected to the grounded line 52. Further, the base and the collector of the p-n-p transistor 49 are connected to each other, and a node at which the constant-current circuit 43 and the emitter of the p-n-p transistor 49 are connected is connected to the base of the second p-n-p transistor 49. The second p-n-p transistor 49 has the emitter connected to the constant-current circuit 43 which is connected to the power supply line 51, and the collector connected to the grounded line 52. Then, a node at which the constant-current circuit 43 and the emitter of the second p-n-p transistor 49 are connected is connected to the base of the third p-n-p transistor 49. The third p-n-p transistor 49 has the emitter connected to the constant-current circuit 43 which is connected to the power supply line 51, and the collector connected to the grounded line 52. Then, the node 50 at which the emitter of the third p-n-p transistor 49 and the constant-current circuit 43 are connected serves as an output terminal of the temperature sensor 7.

The following description is given of the temperature sensor 7 using one p-n-p transistor.

Figure 10:
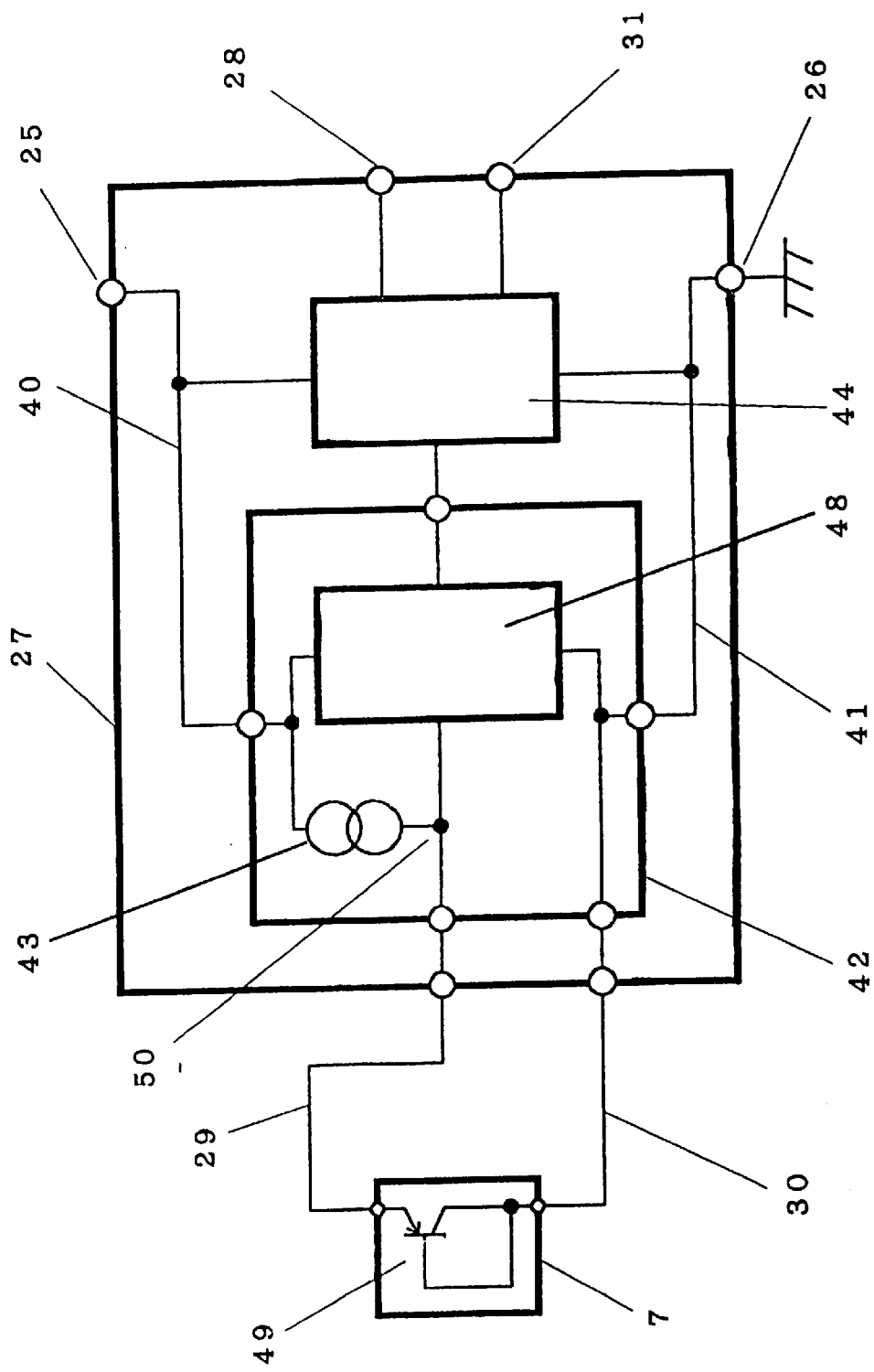
FIG. 10 is a diagram showing the structure of a temperature sensor and a control circuit in a cooling unit according to an embodiment 5 of the present invention.

The p-n-p transistor 49 is made up of a terminal connecting the base and the collector and an emitter terminal as shown in FIG. 10, and both ends thereof are connected to the control circuit 27 through the electrodes 8 and 9 for outputting temperature measurement information which are metal electrodes, etc., the connection bodies 11, 12 formed of the thermoelectric elements and the temperature sensor lines 29 and 30 disposed on the lower substrate 2.

The control circuit 27 is made up of the sensor circuit 42 and the thermoelectric conversion device drive circuit 44 which are connected as shown in FIG. 10. The sensor circuit 42 is formed of the constant-current circuit 43 and a diode signal amplifying circuit 48. The constant-current circuit 43 is made up of, for example, one depletion type MOS transistor. The constant-current circuit 43 within the sensor circuit 42 is designed such that an input terminal thereof is connected to the power supply line 40 whereas an output terminal thereof is connected to the emitter of the p-n-p transistor 49 through the temperature sensor line 29. The base and collector terminals of the p-n-p transistor is connected to the grounded line 41 through the temperature sensor line 30. Further, the node 50 at which the constant-current circuit 43 and the emitter of the p-n-p transistor 49 are connected is connected to an input terminal of the diode signal amplifying circuit 48. The diode signal amplifying circuit 48 is connected to the power supply line 40 and the grounded line 41, and an output terminal of the diode signal amplifying circuit 48 is connected to the input terminal of the thermoelectric conversion device drive circuit 44. The diode signal amplifying circuit 48 is, for example, a circuit made up of a MOS transistor. Further, the thermoelectric conversion device drive circuit 44 is, for example, a circuit made up of a MOS transistor or a bipolar transistor. The thermoelectric conversion device drive circuit 44 is connected to the power supply line 40 and the grounded line 41, and an output of the thermoelectric conversion device drive circuit 44 is connected to the thermoelectric device drive lines 28 and 31 to drive the thermoelectric conversion device. A power is supplied to the temperature sensor 7, the control circuit 27 and the thermoelectric conversion device from the external power supply through the power supply line terminal 25 and the grounded line terminal 26.

The principle of the operation according to this embodiment is that the base and the collector of the p-n-p transistor are grounded as shown in FIG. 9A, and when a constant current is supplied between the emitter and the collector, a voltage between the base and the emitter is linearly changed by temperature, as a result of which a voltage value at the node 50 where the constant current circuit 43 and the p-n-p transistor 49 are connected as shown in FIG. 10 is varied. A variation in the voltage value is amplified by the diode signal amplifying circuit 48 and then inputted to the thermoelectric conversion device drive circuit 44 to control the thermoelectric device drive current in an analog manner. When the temperature of the surface the temperature of which is adjusted reaches the desired temperature, the threshold voltage of the transistor in the thermoelectric device drive circuit 44 and the amplification factor of the diode signal amplifying circuit 48 are set so that the thermoelectric device drive current gets minimum or is prevented from flowing. At this time, since the set temperature cannot be changed after the control circuit 27 is manufactured, the set temperature of the surface to be adjusted of the thermoelectric conversion device must be determined in advance. However, if a mechanism is provided by which the amplification factor of the diode signal amplifying circuit 48 can be trimmed, the set temperature can be changed even after the substrate of the thermoelectric conversion device is manufactured.

With the above structure, the temperature control of the thermoelectric conversion device is controlled in an analog manner, thereby being capable of preventing an object to be adjusted in temperature which is in contact with the surface the temperature of which is adjusted of the thermoelectric conversion device from being adversely affected by noises caused by on/off of the drive current of the thermoelectric conversion device. This is to solve such a problem that communication is adversely affected by noises caused when electricity is switchingly supplied to the thermoelectric conversion device for the purpose of setting the temperature of the surface the temperature of which is adjusted to the desired temperature, particularly in cooling a semiconductor laser apparatus used for communication.

Embodiment 6

A description will be given of a cooling unit that digitally controls the temperature of the thermoelectric conversion device, using a p-n-p transistor 49 as a diode in the temperature sensor 7 according to Embodiment 6 of the present invention. The following description will be given of a cooling device in which the control circuit 27 is integrated with the substrate of the thermoelectric conversion device.

A method of connecting the p-n-p transistor 49 and the control circuit 27 is the same as that in Embodiment 5.

Figure 11:
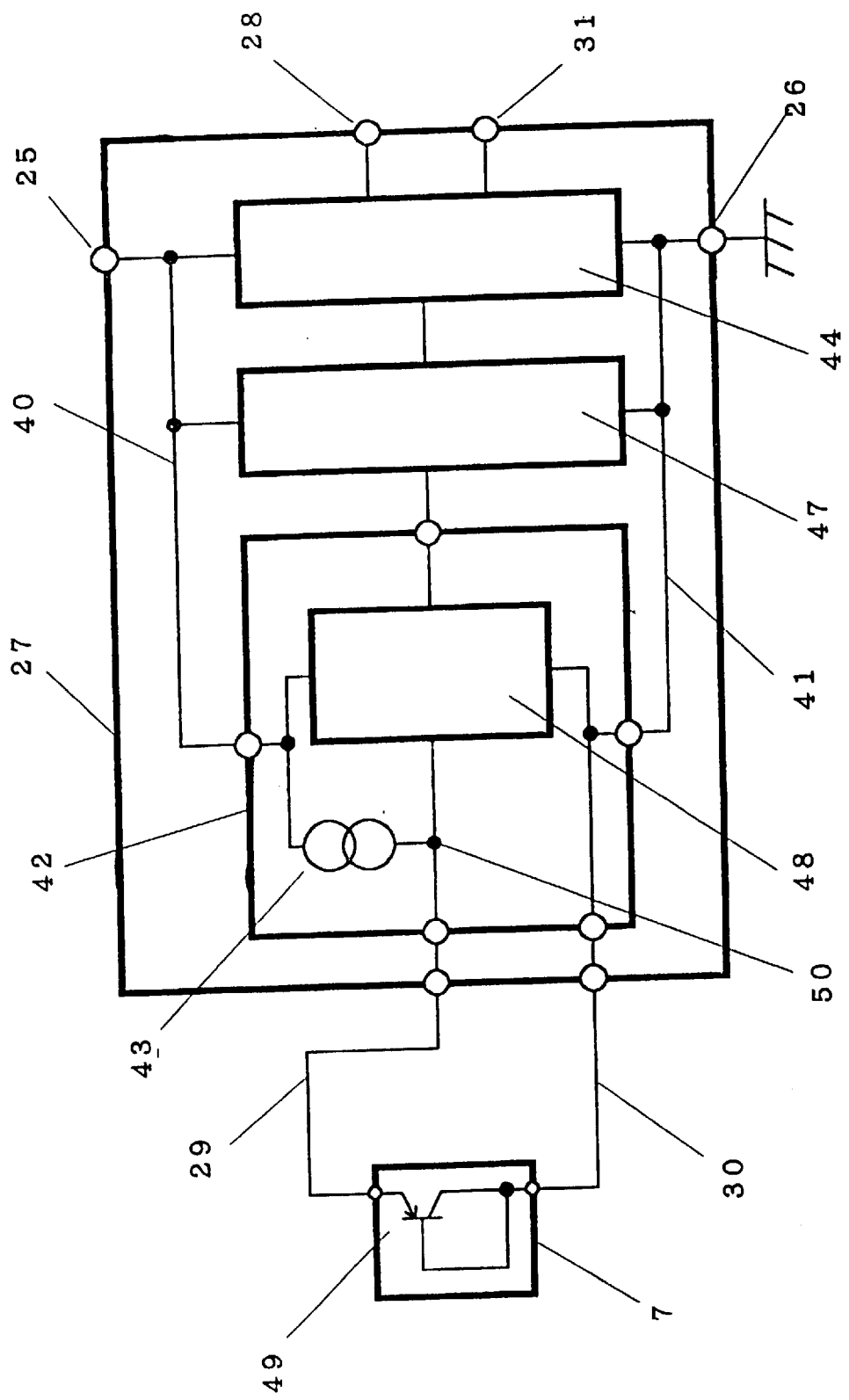
FIG. 11 is a diagram showing the structure of a temperature sensor and a control circuit in a cooling unit according to an embodiment 6 of the present invention.

The control circuit 27 is made up of the sensor circuit 42, the voltage detecting circuit 47 and the thermoelectric conversion device drive circuit 44 which are connected as shown in FIG. 11. The sensor circuit 42 is formed of the constant-current circuit 43 and a diode signal amplifying circuit 48. The constant-current circuit 43 is made up of, for example, one depletion type MOS transistor. The constant-current circuit 43 within the sensor circuit 42 is designed such that an input terminal thereof is connected to the power supply line 40 whereas an output terminal thereof is connected to the emitter of the p-n-p transistor 49 through the temperature sensor line 29. The base and collector terminals of the p-n-p transistor is connected to the grounded line 41 through the temperature sensor line 30. Further, the node 50 at which the constant-current circuit 43 and the emitter of the p-n-p transistor 49 are connected is connected to an input terminal of the diode signal amplifying circuit 48. The diode signal amplifying circuit 48 is connected to the power supply line 40 and the grounded line 41, and an output terminal of the diode signal amplifying circuit 48 is connected to the input terminal of the voltage detecting circuit 44. The voltage detecting circuit 47 is, for example, a circuit made up of a MOS transistor. The voltage detecting circuit 47 is connected to the power supply line 40 and the grounded line 41, and an output of the voltage detecting circuit 47 is connected to an input terminal of the thermoelectric conversion device drive circuit 44. The thermoelectric conversion device drive circuit 44 is, for example, a circuit made up of a MOS transistor or a bipolar transistor. The thermoelectric conversion device drive circuit 44 is connected to the power supply line 40 and the grounded line 41, and an output of the thermoelectric conversion device drive circuit 44 is connected to the thermoelectric device drive lines 28 and 31 to drive the thermoelectric conversion device. A power is supplied to the temperature sensor 7, the control circuit 27 and the thermoelectric conversion device from the external power supply through the power supply line terminal 25 and the grounded line terminal 26.

The principle of the operation according to this embodiment is that the base and the collector of the p-n-p transistor 49 are grounded as shown in FIG. 9A, and when a constant current is supplied between the emitter and the collector, a voltage between the base and the emitter is linearly changed by temperature, as a result of which a voltage value at the node 50 where the constant current circuit 43 and the p-n-p transistor 49 are connected as shown in FIG. 11 is varied. A variation in the voltage value is amplified by the diode signal amplifying circuit 48 and then inputted to the voltage detecting circuit 47. When a voltage value at the node 40 where the constant-current circuit 43 and the p-n-p transistor 49 are connected becomes the set voltage, that is, the temperature of the surface the temperature of which is adjusted becomes the set temperature, a signal to the thermoelectric conversion device drive circuit 44 is cut off. Since the signal from the voltage detecting circuit 47 is cut off, the thermoelectric conversion device drive circuit 44 cuts off the supply of current to the thermoelectric conversion device, thereby stopping the temperature adjustment.

For example, in the case where the temperature of the surface to be adjusted of the thermoelectric conversion device rises and exceeds the set temperature, since the voltage between the base and the emitter of the p-n-p transistor is lowered, the voltage which is inputted to the voltage detecting circuit 47 is also lowered. In this situation, the voltage detecting circuit 47 outputs a signal to the thermoelectric conversion device drive circuit 44 to drive the thermoelectric conversion device. Then, when the temperature of the surface to be adjusted becomes lower than the set temperature, the input voltage to the voltage detecting circuit 47 rises, and the voltage detecting circuit 47 cuts off the signal to the thermoelectric conversion device drive circuit 44, as a result of which the drive current to the thermoelectric conversion device is cut off to stop cooling. Since this process is repeated, the thermoelectric conversion device is switchingly controlled.

The temperature setting method of the surface the temperature of which is adjusted is conducted by changing the detection voltage of the voltage detecting circuit 47 which is different from the method described in Embodiment 5. This setting is that the voltage on the node 50 where the constant-current circuit 43 and the p-n-p transistor 49 are connected and the output voltage of the constant-voltage circuit within the voltage detecting circuit 47 are measured under the set temperature atmosphere, and the polysilicon resistor within the voltage detecting circuit 47 is trimmed so that those two output voltages coincide with each other. As a result, the output voltage of the diode signal amplifying circuit 48 at the set temperature is stored. Hence, in the case where the surface the temperature of which is adjusted is changed in temperature, the output voltage from the p-n-p transistor 49 is changed to send a signal to the thermoelectric conversion device drive circuit 44.

With the above structure, the temperature setting of the thermoelectric conversion device is switchingly controlled, thereby being capable of lowering the power consumption of the cooling unit. Also, the setting temperature of the surface to be adjusted can be changed after the substrate of the thermoelectric conversion device is manufactured, and then a variation in temperature characteristic of the p-n-p transistor 49 due to the manufacturing fluctuation can be absorbed by the voltage detecting circuit, thereby being capable of adjusting the temperature with high accuracy.

Embodiment 7

Figure 12:
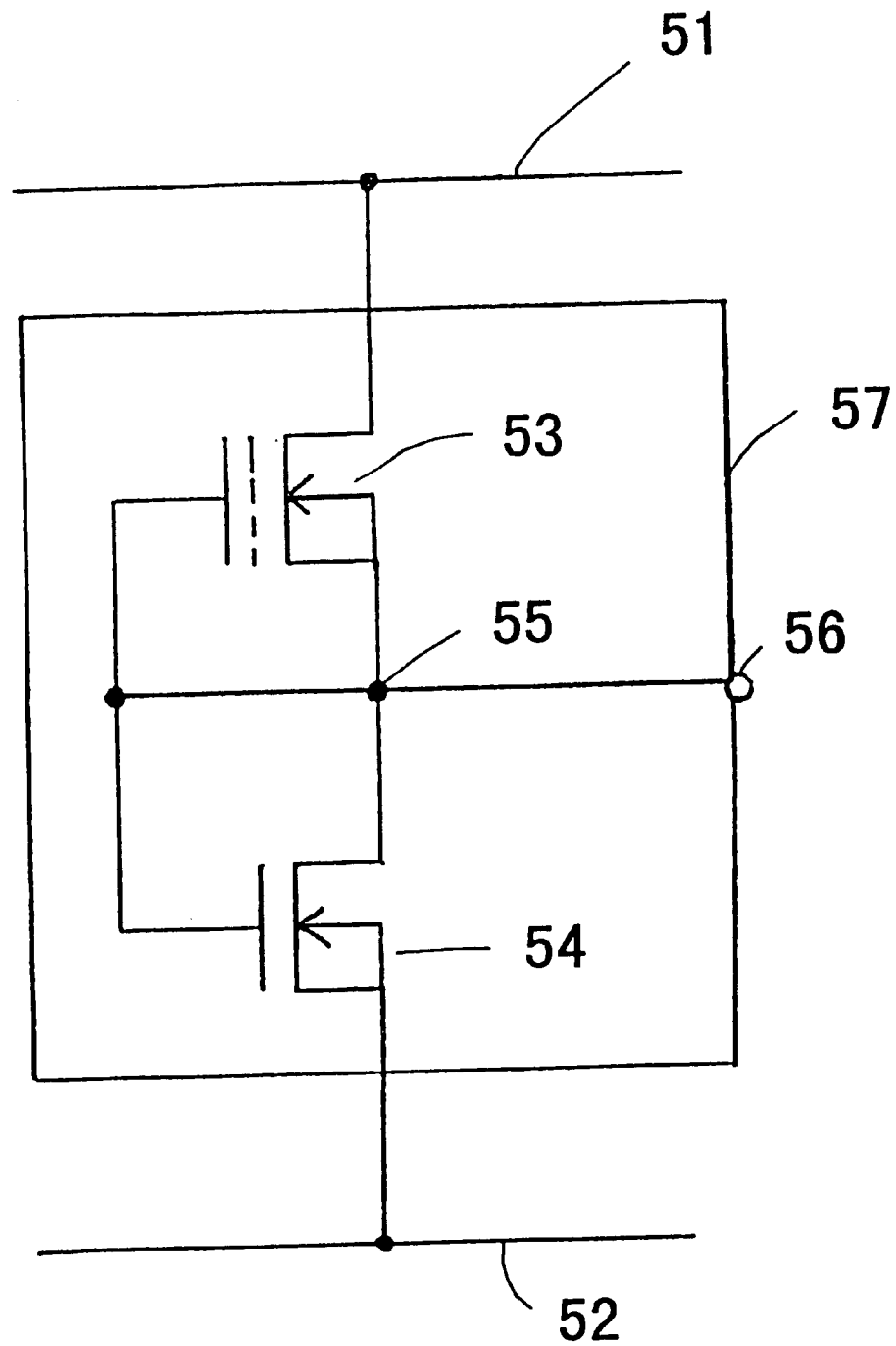
FIG. 12 is a connection diagram when a constant voltage output circuit is used as the temperature sensor in the cooling unit according to embodiments 7 and 8 of the present invention.

A description will be given with reference to FIG. 12 of a cooling unit in which a constant-voltage output circuit is used as a temperature sensor. Using the constant-voltage output circuit 57 manufactured through the semiconductor process as the temperature sensor 7, a change in the output voltage to the temperature is employed as a sensor. In this embodiment, the constant-voltage output circuit 57 is a circuit in which an enhancement type MOS transistor 54 and a depletion type MOS transistor 53 are connected in series. The drain of the depletion type MOS transistor 53 is connected to the power supply line 40 through the temperature sensor line 29, and the source and the gate of the depletion type MOS transistor 53 and the drain and the gate of the enhancement type MOS transistor 54, that is, four points are connected at a node 55 into one, and the source of the enhancement type MOS transistor 54 is connected to the grounded line 52. Normally, the size and the threshold voltage of the MOS transistor are designed such that the output voltage of the constant-voltage output circuit 57 is not changed according to the temperature. However, in this embodiment, the size and the threshold voltage of the MOS transistor are designed such that the output voltage of the constant-voltage output circuit 57 is largely changed according to the temperature. Specifically, the channel width and the channel length of the MOS transistors is set to be large in case of the depletion type MOS transistor 53 but small in case of the enhancement type MOS transistor 54, thereby being capable of manufacturing the constant-voltage output circuit 57 which is largely changed in output voltage according to the temperature.

Figure 13:
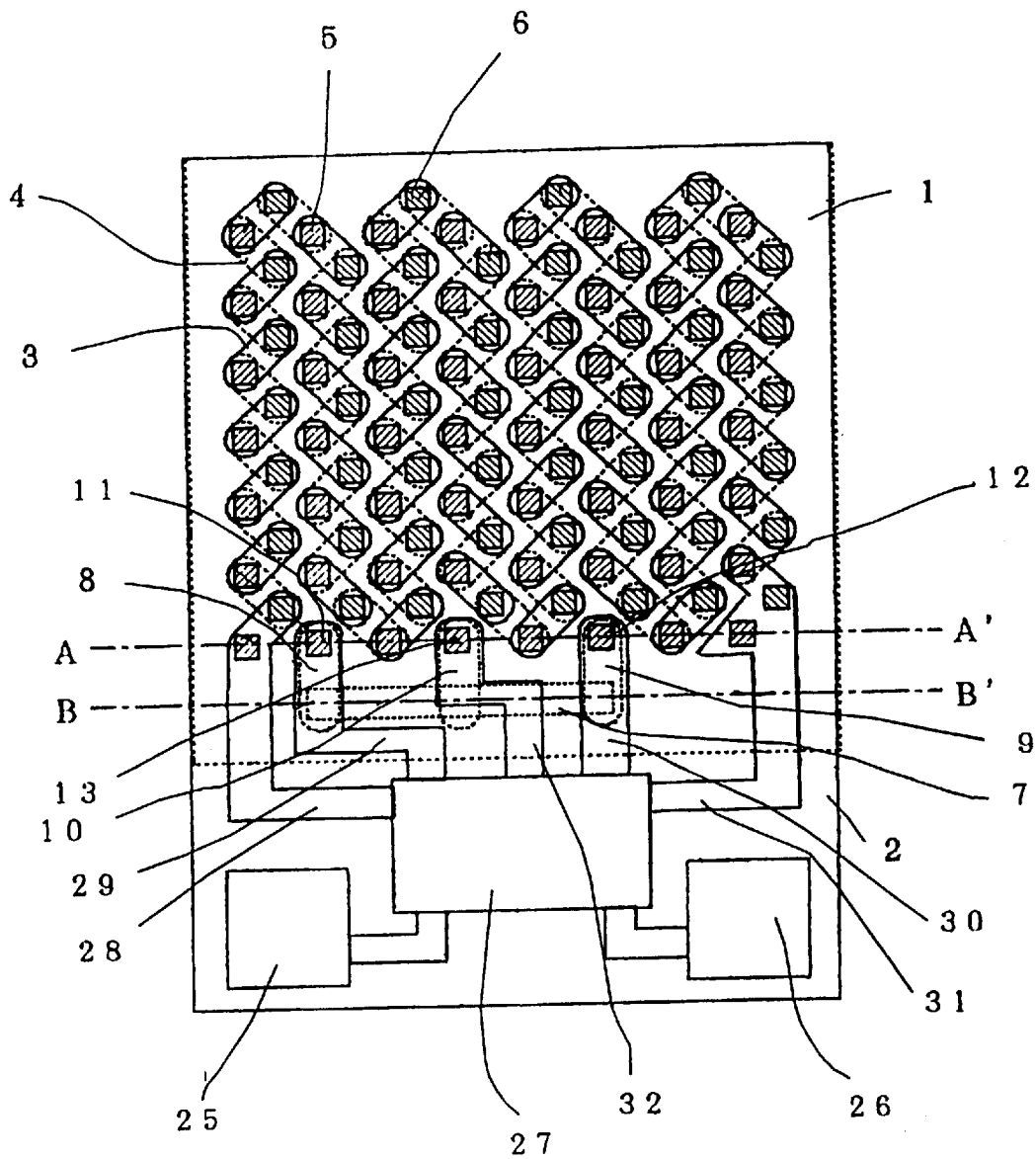
FIG. 13 is a diagram showing the positional relationship of the respective parts on a plane in parallel with a substrate surface of a thermoelectric conversion device in a cooling unit according to embodiments 7 and 8 of the present invention, that is, an arrangement of the main part perspectively viewed from a substrate top surface.

Then, a description will be given of a cooling unit that controls the temperature of the thermoelectric conversion device in an analog fashion, using the constant-voltage output circuit 57 in the temperature sensor 7, where the control circuit 57 is integrated with the substrate of the thermoelectric conversion device. The power supply terminal, the grounded terminal and the output terminal of the constant-voltage output circuit 57 are connected to the electrodes 8, 9 and 10 for outputting temperature measurement information which are made of metal, etc. as shown in FIG. 13, and then connected to the control circuit 27 through the connection bodies 11, 12 and 13 formed of the thermoelectric elements and the temperature sensor lines 29, 30 and 32 disposed on the lower substrate 2.

Figure 14:
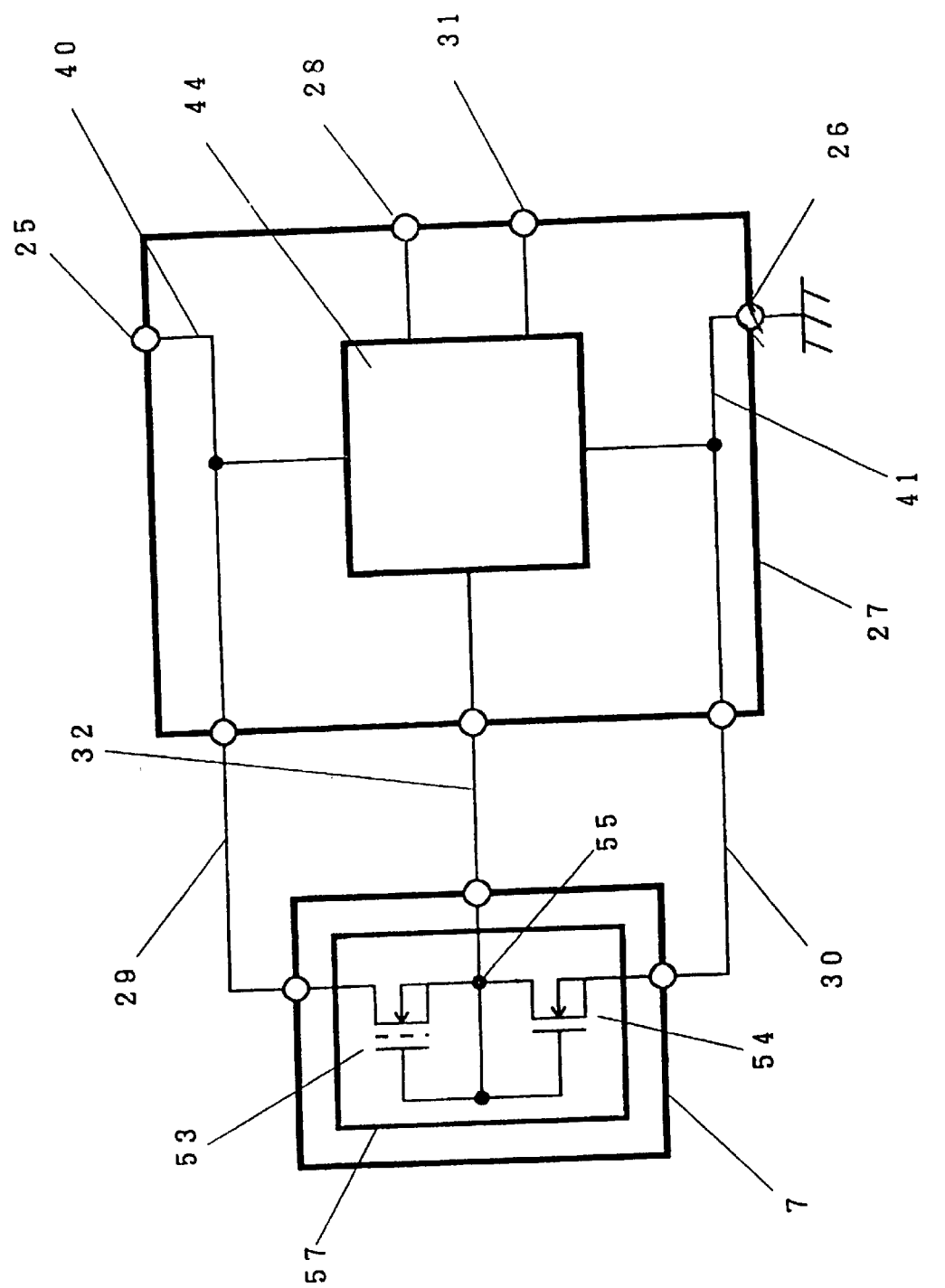
FIG. 14 is a diagram showing the structure of a temperature sensor and a control circuit in a cooling unit according to an embodiment 7 of the present invention.

The control circuit 27 is made up of the thermoelectric conversion device drive circuit 44, which is connected as shown in FIG. 14. The constant-voltage output circuit 57 is a circuit in which an enhancement type MOS transistor 54 and a depletion type MOS transistor 53 are connected in series. The drain of the depletion type MOS transistor 53 is connected to the power supply line 40 through the temperature sensor line 29, and the source and the gate of the depletion type MOS transistor 53 and the drain and the gate of the enhancement type MOS transistor 54, that is, four points are connected at a node 55 into one, and then connected to the input terminal of the thermoelectric conversion device drive circuit 44 through the temperature sensor line 32. Further, the source of the enhancement type MOS transistor 54 is connected to the grounded line 41 through the temperature sensor line 30. The thermoelectric conversion device drive circuit 44 is, for example, a circuit made up of an MOS transistor or a bipolar transistor. The thermoelectric conversion device drive circuit 44 is connected to the source line 40 and the grounded line 41, and the output of the thermoelectric conversion device drive circuit 44 is connected to the thermoelectric device drive lines 28 and 31 to drive the thermoelectric conversion device. A power is supplied to the temperature sensor 7, the control circuit 27 and thermoelectric conversion device from the external power supply through the power supply line terminal 25 and the grounded line terminal 26.

The principle of the operation according to this embodiment is that since the output voltage of the constant-voltage output circuit 57 is changed according to the temperature, the thermoelectric conversion device drive circuit 44 receives the change in the voltage value, for example, the gate electrode of the MOS transistor receives the change in the voltage value to control the thermoelectric device drive current in an analog manner. When the temperature of the surface to be adjusted becomes the set temperature, the threshold voltage of the transistor in the thermoelectric conversion device drive circuit 44 and the output voltage of the constant-voltage output circuit 57 are set so that the thermoelectric device drive current becomes minimum or is not allowed to flow. Since the set temperature cannot be changed after the substrate of the thermoelectric conversion device is manufactured, the set temperature of the surface to be adjusted must be determined in advance. However, if a trimming function is provided in the constant-voltage output circuit 57 to take a method in which trimming is conducted according to the set temperature of the surface to be adjusted, the set temperature can be changed even after the substrate of the thermoelectric conversion device is manufactured.

With the above structure, the temperature control of the thermoelectric conversion device is controlled in an analog manner, thereby being capable of preventing an object to be adjusted in temperature which is in contact with the surface the temperature of which is adjusted, of the thermoelectric conversion device from being adversely affected by noises caused by on/off of the drive current of the thermoelectric conversion device. This is to solve such a problem that noises caused when electricity is switchingly supplied to the thermoelectric conversion device for the purpose of setting the temperature of the surface to be adjusted to the desired temperature, adversely affects communication.

Embodiment 8

Figure 15:
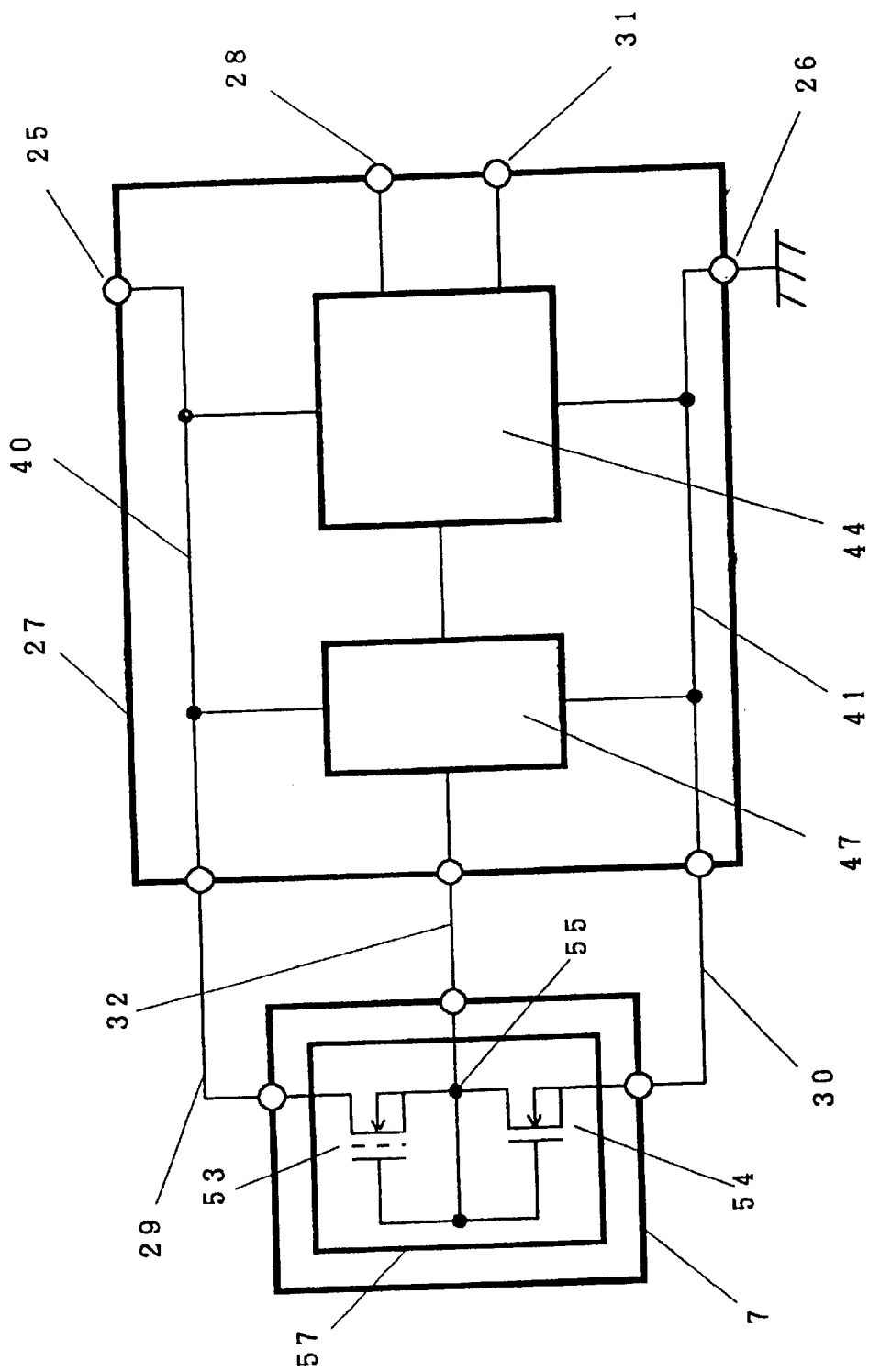
FIG. 15 is a diagram showing the structure of a temperature sensor and a control circuit in a cooling unit according to an embodiment 8 of the present invention.

A description will be given of a cooling unit that digitally controls the temperature of the thermoelectric conversion device, and in which the control circuit 27 is integrated with the substrate of the thermoelectric conversion device, using a constant-voltage output circuit 57 as the temperature sensor 7. A method of connecting the constant-voltage output circuit 57 and the control circuit 27 is the same as that in Embodiment 7. The control circuit 27 is made up of the voltage detecting circuit 47 and the thermoelectric conversion device drive circuit 44, which are connected as shown in FIG. 15. The constant-voltage output circuit 57 is a circuit in which an enhancement type MOS transistor 54 and a depletion type MOS transistor 53 are connected in series. The drain of the depletion type MOS transistor 53 is connected to the power supply line 40 through the temperature sensor line 29, and the source and the gate of the depletion type MOS transistor 53 and the drain and the gate of the enhancement type MOS transistor 54, that is, four points are connected at a node 55 into one, and then connected to the input terminal of the voltage detecting circuit 47 through the temperature sensor line 32. Furthermore, the source of the enhancement type MOS transistor 54 is connected to the grounded line 41 through the temperature sensor line 30. The voltage detecting circuit 47 is, for example, a circuit made up of a MOS transistor. The voltage detecting circuit 47 is connected to the power supply line 40 and the grounded line 41, and the output of the voltage detecting circuit 47 is connected to the input of the thermoelectric device drive circuit 44. The thermoelectric device drive circuit 44 is, for example, a circuit made up of a MOS transistor or a bipolar transistor. The thermoelectric conversion device drive circuit 44 is connected to the power supply line 40 and the grounded line 41, and an output of thermoelectric conversion device drive circuit 44 is connected to the thermoelectric device drive lines 28 and 31 to drive the thermoelectric conversion device. A power is supplied to the temperature sensor 7, the control circuit 27 and thermoelectric conversion device from the external power supply through the power supply line terminal 25 and the grounded line terminal 26.

The principle of the operation according to this embodiment is that since the output voltage of the constant-voltage output circuit 57 is changed according to the temperature, the voltage detecting circuit 47 receives the change in the voltage value, and when the voltage becomes the set voltage, that is, the temperature of the surface to be adjusted becomes the set temperature, a signal to thermoelectric conversion device drive circuit 44 is cut off. Since the signal from the voltage detecting circuit 47 is cut off, the thermoelectric conversion device drive circuit 44 cuts off the supply of current to the thermoelectric conversion device, thereby stopping the temperature adjustment. For example, in the case where the temperature of the surface to be adjusted rises and exceeds the set temperature, since the output voltage of the constant-voltage output circuit 57 rises, the voltage inputted to the voltage detecting circuit 47 also rises. In this situation, the voltage detecting circuit 47 outputs the signal to the thermoelectric conversion device drive circuit 44 to drive the thermoelectric conversion device. Then, when the temperature of the surface to be adjusted becomes lower than the set temperature, the input voltage to the voltage detecting circuit 47 is lowered, and the voltage detecting circuit 47 cuts off the signal to the thermoelectric conversion device drive circuit 44, as a result of which the drive current to the thermoelectric conversion device is cut off to stop cooling. Since this process is repeated, the thermoelectric conversion device is switchingly controlled.

The temperature setting of the surface to be adjusted is conducted by changing the detected voltage of the voltage detecting circuit 47 which is different from the method described in Embodiment 7. This setting is that the output voltage of the constant-voltage output circuit 57 and the output voltage of the voltage-division resistor within the voltage detecting circuit 47 are measured under the set temperature atmosphere, and the polysilicon resistor within the voltage detecting circuit 47 is trimmed so that those two output voltages coincide with each other. As a result, the output voltage of the temperature sensor 7 at the set temperature is stored. Hence, in the case where the surface the temperature of which is adjusted is changed in temperature, the output voltage from the constant-voltage output circuit 57 is changed to send a signal to the thermoelectric conversion device drive circuit 44.

With the above structure, the temperature setting of the thermoelectric conversion device is switchingly controlled, thereby being capable of lowering the power consumption of the cooling unit. Also, the setting temperature of the surface to be adjusted can be changed after the substrate of the thermoelectric conversion device is manufactured, and then a variation in the output voltage of the constant-voltage output circuit 57 due to the manufacturing fluctuation can be absorbed by the voltage detecting circuit, thereby being capable of adjusting the temperature with high accuracy.

As the first advantage of the present invention, the cooling unit of the present invention is structured such that a temperature sensor is formed on at least one of substrates that form a thermoelectric conversion device to which thermoelectric elements are connected, an input/output electrode extending from the temperature sensor and an electrode formed on the other surface opposed to the substrate on which the temperature sensor is formed are connected to each other by electrically conductive material, and a control circuit for controlling a current supplied to the thermoelectric conversion device according to an output of the temperature sensor is connected thereto. With this structure, only one surface of the substrate is subjected to a manufacturing process which is very advantageous in the mounting operability, etc., in comparison with a case in which the temperature sensor is mounted on the opposite surface, there is no necessity that a temperature sensor such as a thermistor which is supplied as a chip part is mounted on the substrate that constitutes a thermoelectric conversion device, and there is no necessity that a temperature sensor is connected directly to the external on a surface to be adjusted of the thermoelectric conversion device so that a thermal load on the surface to be adjusted can be reduced. This is very effective in the small-sized thermoelectric conversion device. For example, the semiconductor laser used for optical communication requires the thermoelectric conversion device for heating. However, because the thermoelectric conversion device as used is small, for example, several mm square in size, the sensor for temperature control or the like is mounted on the thermoelectric conversion device to largely adversely affect the cooling performance. This leads to a problem relating to the downsizing and the power consumption as a while. However, the cooling unit of the present invention improves those problems. Also, with the connection of the control circuit, the temperature of the surface to be adjusted can be adjusted with high accuracy. In particular, in the semiconductor laser or the like, there arises such a problem that the temperature rising due to the heating makes the output wavelength change. The cooling unit of the present invention adjusts the temperature with high accuracy, thereby being capable of stabilizing the output wavelength of the semiconductor laser.

Also, because the temperature sensor is integrated with the lower substrate, the temperature can be adjusted more accurately. In particular, up to now, the measurement accuracy of the physical constant of the thermoelectric conversion device per se, for example, the Seebeck coefficient, and so on were large in error due to the thermal load due to the external temperature sensor and the lead wire. However, in the thermoelectric conversion device according to the present invention, more accurate measurement is enabled.

As the second advantage of the present invention, the semiconductor material where an insulating layer is formed on the surface of the substrate of the thermoelectric conversion device, with the result that in a very small thermoelectric conversion device such that thermoelectric material chips of several tens to several hundred are joined to the substrate of about several mm square, a large number of thermoelectric conversion devices can be prepared from a single substrate through the semiconductor manufacturing process excellent in fining. The temperature sensor using the semiconductor characteristic and the control circuit are also prepared at the time of manufacturing the substrate of the thermoelectric conversion device, thereby being capable of manufacturing the cooling unit with easy and at the low costs.

As the third advantage of the present invention, the control circuit is integrated with the other substrate opposed to the substrate on which the temperature sensor is formed on the same plane as the thermoelectric element joint electrode. Therefore, the mounting process of the control circuit is reduced to lower the costs. In particular, in the thermoelectric conversion device that is small such as about several mm square, the scale merits disappear by mounting the control circuit separately. However, the space efficiency is improved by forming the control circuit within the substrate of the thermoelectric conversion device. Also, because the temperature sensor and the control circuit are formed on the substrate during the same process, the matching of the temperature sensor and the control circuit becomes excellent to reduce the examination process.

As the fourth advantage of the present invention, the control circuit is designed such that an input/output terminal of the temperature sensor and the sensor circuit are connected to each other, the sensor circuit is connected to a power supply line and a grounded line, an output terminal of the sensor circuit and an input terminal of the thermoelectric conversion device drive circuit are connected to each other, the thermoelectric conversion device drive circuit is connected to the power supply line and the grounded line, and an output terminal of the thermoelectric conversion device drive circuit and the thermoelectric conversion device are connected. With this structure, the temperature of the thermoelectric conversion device is controlled in an analog manner, thereby being capable of preventing an object to be adjusted in temperature which is in contact with the surface the temperature of which is adjusted of the thermoelectric conversion device from being adversely affected by noises caused by on/off of the drive current of the thermoelectric conversion device.

As the fifth advantage of the present invention, the control circuit is designed in such a manner that an input/output terminal of the temperature sensor and the sensor circuit are connected to each other, the sensor circuit is connected to a power supply line and a grounded line, an output terminal of the sensor circuit and an input terminal of a voltage detecting device are connected to each other, the voltage detecting circuit is connected to the power supply line and the grounded line, an output terminal of the voltage detecting circuit and an input terminal of the thermoelectric conversion device drive circuit are connected to each other, the thermoelectric conversion device drive circuit is connected to the power supply line and the grounded line, and an output terminal of the thermoelectric conversion device drive circuit and the thermoelectric conversion device are connected to each other. With this structure, since the temperature of the thermoelectric conversion device is digitally controlled so that the thermoelectric conversion device is switchingly driven, the temperature control can be performed with low power consumption. Also, the set temperature of the surface to be adjusted can be changed after the substrate of the thermoelectric conversion device is manufactured, and also a variation in the characteristic of the temperature sensor due to the manufacturing fluctuation can be absorbed by the voltage detecting circuit, thereby being capable of adjusting the temperature with high accuracy.

As the sixth advantage of the present invention, a resistor, a diode or a transistor is used for the temperature sensor. With this structure, the temperature sensor can be prepared at the time of manufacturing the substrate of the thermoelectric conversion device, thereby being capable of reducing the costs. Also, since the resistor, the diode and the transistor are formed using the semiconductor process, a high-sensitive temperature sensor can be formed, thereby being capable of adjusting the temperature of the thermoelectric conversion device high in the accuracy of temperature.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A cooling unit, comprising:
    a thermoelectric conversion device in which p-type thermoelectric material elements and n-type thermoelectric material elements are interposed between first and second opposed substrates, and the p-type thermoelectric material elements and the n-type thermoelectric material elements are connected as p-n junctions through an electrically conductive material disposed on the substrates;
    a temperature sensor integrated in the first substrate and formed on a surface thereof on which the thermoelectric material elements made of thermally conductive material are disposed and interposed between the first and second substrates;
    an electrically conductive material connecting an electrode of the temperature sensor and an electrode formed on the second substrate opposed to the first substrate on which the temperature sensor is formed for taking the input/output of the temperature sensor; and
    a control circuit for controlling a current applied to the thermoelectric conversion device in accordance with the output of the temperature sensor.

2. A cooling unit as claimed in claim 1; wherein the first substrate is formed of a semiconductor material, and an insulating layer is formed on the surface of the first substrate, and the electrically conductive material connecting the p-type thermoelectric conversion elements and the n-type thermoelectric material elements in p-n junctions is provided on the insulating layer.

3. A cooling unit as claimed in claim 1; wherein the control circuit is integrated in an inner surface of one of the substrates on which the thermoelectric material elements are disposed.

4. A cooling unit as claimed in any one of claims 1 to 3; wherein the control circuit comprises a sensor circuit and a thermoelectric conversion device drive circuit;

wherein an input/output terminal of the temperature sensor is connected to the sensor circuit;

wherein the sensor circuit is connected to a power supply line and a ground line;

wherein an output terminal of the sensor circuit is connected to the input terminal of the thermoelectric conversion device drive circuit;

wherein the thermoelectric conversion device drive circuit is connected to the power supply line and the ground line; and wherein the output terminal of the thermoelectric conversion device drive circuit is connected to the thermoelectric conversion device.

5. A cooling unit as claimed in any one of claims 1 to 3; wherein the control circuit comprises a sensor circuit, a voltage detecting circuit and a thermoelectric conversion device drive circuit;

wherein an input/output terminal of the temperature sensor is connected to the sensor circuit;

wherein the sensor circuit is connected to a power supply line and a ground line;

wherein an output terminal of the sensor circuit is connected to the input terminal of the voltage detecting circuit;

wherein the voltage detecting circuit is connected to the power supply line and the ground line;

wherein an output terminal of the voltage detecting circuit is connected to an input terminal of the thermoelectric conversion device drive circuit;

wherein the thermoelectric conversion device drive circuit is connected to the power supply line and the ground line; and wherein the output terminal of the thermoelectric conversion device drive circuit is connected to the thermoelectric conversion device.

6. A cooling unit as claimed in claim 2; wherein the temperature sensor integrated in the substrate and formed on a surface thereof on which is interposed between the thermoelectric material elements comprises a constant-voltage output circuit formed of one of a diffusion resistor, a polysilicon resistor formed by ion implantation, a diode formed from a p-type diffusion region and an n-type diffusion region, and a constant-voltage output circuit formed of a semiconductor transistor.

7. A cooling unit according to claim 1; wherein the substrate in which the temperature sensor is integrated is formed of a material having a high thermal conductivity and a high thermal diffusivity so that the temperature measured at the surface of the substrate in which the temperature sensor is integrated is close to the temperature at the opposite surface of the same substrate.

8. A cooling unit according to claim 1; wherein the control circuit is integrated in one of the first and second substrates and an internal resistance of each thermoelectric material element is within the range of about 0.1 Ω to 1000 Ω to limit current in the thermoelectric material elements so that the control circuit does not become overheated.

9. A cooling unit according to claim 1; wherein the thermoelectric material elements are formed of a Bi—Te material.

10. A cooling unit according to claim 1; wherein the thermoelectric material elements have a size of approximately 120 microns by 120 microns in length and width and a height of approximately 600 microns, and approximately 100 p-n junctions are formed of the thermoelectric material elements, and wherein the thermoelectric conversion device has a size of approximately 3 mm×3 mm in length and width and a height of approximately 1.3 mm.

11. A cooling unit according to claim 1; wherein the first substrate in which the temperature sensor is integrated is formed of a semiconductor material, and the temperature sensor comprises a diffused resistor formed in the semiconductor material, so that the temperature detecting characteristic of the temperature sensor comprises a variation in resistance with respect to temperature.

12. A cooling unit according to claim 1; wherein the temperature sensor comprises a polysilicon resistor formed on the first substrate, so that the temperature detecting characteristic of the temperature sensor comprises a variation in resistance with respect to temperature.

13. A cooling unit according to claim 12; wherein the polysilicon resistor comprises $5 \times 10^{14}$ ions implanted into a polysilicon film having a thickness of approximately 0.35 microns formed on the first substrate to provide a specific resistance of 5 to 10 kΩ per unit length.

14. A cooling unit according to claim 1; wherein control circuit comprises a sensor circuit for supplying a constant current to the temperature sensor, and a thermoelectric conversion device drive circuit for receiving an output of the sensor circuit and driving the thermoelectric conversion device to maintain a desired temperature level.

15. A cooling unit according to claim 14; wherein the sensor circuit comprises a constant current circuit for supplying a constant current to the temperature sensor.

16. A cooling unit according to claim 15; wherein the constant current circuit comprises a MOS transistor.

17. A cooling unit according to claim 14; wherein the thermoelectric conversion device drive circuit comprises one of a MOS transistor and a bipolar transistor.

18. A cooling unit according to claim 14; wherein the sensor circuit and temperature sensor are connected at a node, and the node is connected to an input of the thermoelectric conversion device drive circuit.

19. A cooling unit according to claim 14; wherein a threshold voltage of the thermoelectric conversion device drive circuit and a characteristic of the temperature sensor are set such that a thermoelectric drive current applied to the thermoelectric conversion device by the thermoelectric conversion device drive circuit is cut off when the temperature reaches a desired temperature.

20. A cooling unit according to claim 1; wherein the control circuit comprises a sensor circuit, a voltage detecting circuit and a thermoelectric conversion device driving circuit.

21. A cooling unit according to claim 20; wherein the sensor circuit comprises a constant current circuit for supplying a constant current to the temperature sensor.

22. A cooling unit according to claim 21; wherein the constant current circuit comprises a MOS transistor.

23. A cooling unit according to claim 20; wherein the thermoelectric conversion device drive circuit comprises one of a MOS transistor and a bipolar transistor.

24. A cooling unit according to claim 20; wherein the sensor circuit and temperature sensor are connected at a node, the node is connected to an input of the voltage detecting circuit, and an output of the voltage detecting circuit is supplied as an input to the thermoelectric conversion device drive circuit.

25. A cooling unit according to claim 24; wherein the voltage detecting circuit comprises a MOS transistor.

26. A cooling unit according to claim 4; wherein the temperature sensor comprises a constant voltage device, the sensor circuit applies a constant current to the temperature sensor, the thermoelectric conversion device drive circuit outputs a driving current for driving the thermoelectric conversion device in response to a temperature-induced variation in voltage of the constant voltage device.

27. A cooling unit according to claim 5; wherein the temperature sensor comprises a constant voltage device, the sensor circuit applies a constant current to the temperature sensor, the voltage detecting circuit detects a temperature-induced variation in output voltage of the temperature sensor, and the thermoelectric conversion device drive circuit outputs a driving current for driving the thermoelectric conversion device in response to a temperature-induced variation in voltage of the constant voltage device.

28. A cooling unit comprising: a thermoelectric conversion device including a semiconductor substrate having an insulating layer on a first surface thereof, an opposed substrate spaced from the semiconductor substrate by a gap, a plurality of electrodes formed on the first surface of the semiconductor substrate over the insulating layer, p-type thermoelectric material elements and n-type thermoelectric material elements interposed between the opposed substrates, the p-type thermoelectric material elements and the n-type thermoelectric material elements being electrically connected to the electrodes to form a plurality of p-n junctions; a temperature sensor integrated in the semiconductor substrate and formed on the first surface thereof; an electrically conductive material connecting the temperature sensor and an output electrode formed on a surface of one of the substrates; and a control circuit for controlling a current applied to the thermoelectric conversion device in accordance with an output of the temperature sensor.

29. A cooling unit according to claim 28; wherein the conductive material comprises at least one of the p-type thermoelectric material elements and the n-type thermoelectric material elements.

30. A cooling unit according to claim 28; wherein the temperature sensor has an input/output terminal, and the conductive material is connected to the input/output terminal and an output electrode formed on the opposed substrate.

31. A cooling unit comprising: a thermoelectric conversion device including a first semiconductor substrate having an insulating layer formed on a first surface thereof, a second semiconductor substrate opposing the first semiconductor substrate and having an insulating layer formed on a first surface thereof, the first surfaces of the first and second substrates being opposed from each other and spaced by a gap, a plurality of electrodes formed on the first surfaces of the first and second semiconductor substrate over the respective insulating layers, p-type thermoelectric material elements and n-type thermoelectric material elements interposed between the opposed substrates, the p-type thermoelectric material elements and the n-type thermoelectric material elements being electrically connected to the electrodes to form a plurality of p-n junctions between the first and second semiconductor substrates; a temperature sensor integrated in the first semiconductor substrate on the first surface thereof; an electrically conductive material connecting the temperature sensor and an output electrode formed on a surface of the second semiconductor substrate; and a control circuit for controlling a current applied to the thermoelectric conversion device in accordance with an output of the temperature sensor.

32. A cooling unit according to claim 31; wherein the conductive material comprises at least one of the p-type thermoelectric material elements and the n-type thermoelectric material elements.

33. A cooling unit according to claim 31; wherein the temperature sensor has an input/output terminal, and the conductive material is connected to the input/output terminal and an output electrode formed on the second substrate.

* * * * *